US010109747B2

(12) United States Patent
Jang et al.

(10) Patent No.: US 10,109,747 B2
(45) Date of Patent: Oct. 23, 2018

(54) SEMICONDUCTOR MEMORY DEVICES AND METHODS OF FABRICATING THE SAME

(71) Applicant: SAMSUNG ELECTRONICS CO., LTD., Suwon-si, Gyeonggi-do (KR)

(72) Inventors: Byong-Hyun Jang, Suwon-si (KR); Juhyung Kim, Yongin-si (KR); Woonkyung Lee, Seongnam-si (KR); Jaegoo Lee, Suwon-si (KR); Chaeho Kim, Gwangmyeong-si (KR); Junkyu Yang, Seoul (KR); Phil Ouk Nam, Hwaseong-si (KR); Jaeyoung Ahn, Seongnam-si (KR); Kihyun Hwang, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 564 days.

(21) Appl. No.: 14/831,449

(22) Filed: Aug. 20, 2015

(65) Prior Publication Data

US 2015/0357346 A1  Dec. 10, 2015

Related U.S. Application Data

(63) Continuation of application No. 13/800,872, filed on Mar. 13, 2013, now Pat. No. 9,130,054.

(30) Foreign Application Priority Data

Jul. 31, 2012 (KR) .......................... 10-2012-0084086

(51) Int. Cl.
*H01L 29/792* (2006.01)
*H01L 29/66* (2006.01)
(Continued)

(52) U.S. Cl.
CPC .......... *H01L 29/792* (2013.01); *H01L 23/528* (2013.01); *H01L 27/11582* (2013.01);
(Continued)

(58) Field of Classification Search
CPC ...................................................... H01L 29/792
See application file for complete search history.

(56) References Cited

U.S. PATENT DOCUMENTS 7,875,922 B2  1/2011  Arai et al.
8,008,710 B2  8/2011  Fukuzumi et al.
(Continued)

FOREIGN PATENT DOCUMENTS

JP  07183486  7/1995
JP  2008147548  6/2008
(Continued)

*Primary Examiner* — Marvin Payen
(74) *Attorney, Agent, or Firm* — F. Chau & Associates, LLC

(57) ABSTRACT

A semiconductor memory device and a method of fabricating the same. The device includes a plurality of gates vertically stacked on a top surface of a substrate with an epitaxial layer formed in the substrate, a vertical channel vertically penetrating the gates to be electrically connected to the epitaxial layer, and a memory layer provided between the vertical channel and the gates. The epitaxial layer has a top surface positioned at a level between a bottom surface of the lowermost one of the gates and the top surface of the substrate.

19 Claims, 34 Drawing Sheets

(51) Int. Cl.
- *H01L 29/423* (2006.01)
- *H01L 29/04* (2006.01)
- *H01L 29/10* (2006.01)
- *H01L 23/528* (2006.01)
- *H01L 29/51* (2006.01)
- *H01L 27/11582* (2017.01)
- *H01L 27/1157* (2017.01)

(52) U.S. Cl.
CPC ........ *H01L 29/045* (2013.01); *H01L 29/1037* (2013.01); *H01L 29/42364* (2013.01); *H01L 29/511* (2013.01); *H01L 29/66833* (2013.01); *H01L 29/7926* (2013.01); *H01L 27/1157* (2013.01); *H01L 2924/0002* (2013.01)

(56) References Cited

U.S. PATENT DOCUMENTS

| | | | |
|---|---|---|---|
| 8,076,198 | B2 | 12/2011 | Lee et al. |
| 8,084,805 | B2 | 12/2011 | Shim et al. |
| 8,084,819 | B2 | 12/2011 | Kim et al. |
| 2008/0142885 | A1 | 6/2008 | Mineji |
| 2008/0157092 | A1 | 7/2008 | Arai et al. |
| 2009/0321816 | A1 | 12/2009 | Son et al. |
| 2010/0112769 | A1 | 5/2010 | Son et al. |
| 2010/0155818 | A1 | 6/2010 | Cho et al. |
| 2010/0181610 | A1 | 7/2010 | Kim et al. |
| 2010/0237504 | A1 | 9/2010 | Hong et al. |
| 2010/0248439 | A1 | 9/2010 | Chung et al. |
| 2010/0258852 | A1 | 10/2010 | Lim et al. |
| 2010/0320528 | A1 | 12/2010 | Jeong et al. |
| 2010/0327340 | A1 | 12/2010 | Oota et al. |
| 2011/0045657 | A1 | 2/2011 | Kim et al. |
| 2011/0073866 | A1 | 3/2011 | Kim et al. |
| 2011/0129992 | A1 | 6/2011 | Jung |
| 2011/0140070 | A1 | 6/2011 | Kim |
| 2011/0303970 | A1 | 12/2011 | Kim et al. |
| 2012/0009747 | A1 | 1/2012 | Kang et al. |
| 2012/0032245 | A1 | 2/2012 | Hwang et al. |
| 2012/0068255 | A1 | 3/2012 | Lee et al. |

FOREIGN PATENT DOCUMENTS

| | | |
|---|---|---|
| JP | 2008159804 | 7/2008 |
| JP | 2011-066348 | 3/2011 |
| KR | 102010b024096 | 3/2010 |
| KR | 1020100034612 | 4/2010 |
| KR | 1020100111130 | 10/2010 |
| KR | 1020100133212 | 12/2010 |
| KR | 1020110064551 | 6/2011 |
| KR | 1020110118961 | 11/2011 |

SEMICONDUCTOR MEMORY DEVICES AND METHODS OF FABRICATING THE SAME

CROSS-REFERENCE TO RELATED APPLICATIONS

This application is a continuation of U.S. application Ser. No. 13/800,872 filed on Mar. 13, 2013, which claims priority under 35 U.S.C. § 119 to Korean Patent Application No. 10-2012-0084086, filed Jul. 31, 2012, in the Korean Intellectual Property Office, the entire contents of which are hereby incorporated by reference.

TECHNICAL FIELD

Embodiments of the inventive concepts relate to a semiconductor device, and in particular, to a semiconductor memory device and a method of fabricating the same.

DISCUSSION OF THE RELATED ART

Due to their small-sized, multifunctional, and/or low-cost characteristics, semiconductor devices are widely used in the electronic industry. Higher integration of semiconductor devices is required to satisfy consumer demands for superior performance and inexpensive prices. In the case of semiconductor memory devices, since their integration is a factor in determining product prices, increased integration has been required.

In the case of two-dimensional or planar semiconductor memory devices, since their integration is determined by the area occupied by a unit memory cell, integration is influenced by the level of a fine pattern forming technology. However, the expensive process equipment needed to increase pattern fineness may result in a practical limitation on increasing integration for two-dimensional or planar semiconductor memory devices. To address such a limitation, there have been recently proposed three-dimensional semiconductor memory devices having three-dimensionally arranged memory cells.

SUMMARY

Example embodiments of the inventive concept provide a semiconductor memory device including three-dimensionally arranged memory cells and a method of fabricating the same.

Example embodiments of the inventive concept provide a semiconductor memory device with improved electric characteristics and a method of fabricating the same.

Example embodiments of the inventive concept provide a miniaturizable semiconductor memory device and a method of fabricating the same. According to example embodiments of the inventive concept, a semiconductor memory device, comprises a substrate, a gate stack vertically stacked on the substrate, a channel hole penetrating the gate stack to the substrate, and a channel in the channel hole and electrically connected to the substrate, wherein the substrate comprises an epitaxial layer in the substrate below the channel hole, wherein a top surface of the epitaxial layer is positioned at or higher than a top surface of the substrate, and under a bottom surface of a lowermost gate of the gate stack.

In example embodiments, the top surface of the epitaxial layer may have a flat shape or an arc shape. When the top surface of the epitaxial layer has the arc shape, the arc shape may protrude convexly from the top surface of the substrate toward the bottom surface of the lowermost gate, or concavely toward the top surface of the substrate.

In example embodiments, the channel may contact the top surface of the epitaxial layer.

In example embodiments, the device may further comprise a memory layer surrounding the channel, wherein the memory layer comprises at least one insulating layer on the top surface of the epitaxial layer and vertically extending along the channel. The memory layer may further comprise at least one insulating layer surrounding gates of the gate stack.

In example embodiments, the gate stack may comprise a plurality of insulating layers alternatingly stacked with a plurality of gates, and a thickness of a lowermost insulating layer of the plurality insulating layers may be less than a thickness of a next stacked insulating layer in the gate stack.

In example embodiments, the epitaxial layer may comprise a same material as the substrate.

In example embodiments, a crystal axis of the epitaxial layer may be oriented in a different direction from that of the substrate, or a same direction as that of the substrate.

In example embodiments, the epitaxial layer may have the same conductivity type as the substrate.

In example embodiments, the at least one insulating layer may comprises a vertical portion vertically extending along the channel and a horizontal portion horizontally extending along and overlapping the top surface of the epitaxial layer.

In example embodiments, the channel may be a multi-layered structure comprising a cylindrical semiconductor layer having a closed bottom portion connected to the epitaxial layer and an open top portion and an inner insulating layer surrounded by the semiconductor layer. A width of the closed bottom portion may taper outward or inward with decreasing distance from the epitaxial layer. The closed bottom portion may have a substantially triangular shape In example embodiments, the channel may be a single layered structure comprising a semiconductor layer connected to the epitaxial layer and vertically extending along the channel hole.

In example embodiments, the gate stack may comprise a plurality of insulating layers alternatingly stacked with a plurality of gates, a lowermost gate of the plurality of gates may be connected to a ground selection line, and a next stacked gate of the plurality of gates may be connected to a word line, and a structure of the channel adjacent the lowermost gate may be the same as a structure of the channel adjacent the next stacked gate.

According to example embodiments of the inventive concept, a method of fabricating a semiconductor memory device comprises forming a gate stack on a substrate by alternatingly stacking a plurality of gates with a plurality of insulating layers, forming a channel hole exposing the substrate through the gate stack, recessing the substrate exposed by the channel hole to form a recess region below the channel hole, and epitaxially growing a material in the recess region, wherein a top surface of the epitaxial layer is positioned at or higher than a top surface of the substrate, and under a bottom surface of a lowermost gate of the plurality of gates of the gate stack.

In example embodiments, the method may further comprise providing a vertical channel and a memory layer in the channel hole, wherein the vertical channel is electrically connected to the substrate and contacts the epitaxial layer, and wherein the memory layer is positioned between the vertical channel and the plurality of gates.

In example embodiments, recessing the substrate may be performed after or simultaneously with forming the channel hole.

In example embodiments, epitaxially growing a material in the recess region may comprise supplying a source gas onto the substrate, the source gas containing the same elements as a material of the substrate, and supplying a doping gas onto the substrate, the doping gas containing impurities with the same conductivity type as the substrate, wherein the doping gas is supplied after or during the supplying of the source gas. The source gas may comprise silicon, for example, at least one of $SiCl_4$, $SiH_4$, $SiH_2Cl_2$, $Si_2H_6$, $Si_3H_8$, $SiH_3Cl$ or $SiHCl_3$.

In example embodiments, the epitaxial layer may be formed to have the top surface, which is coplanar with the top surface of the substrate.

In example embodiments, the epitaxial layer may be formed to be flat.

In example embodiments, the top surface of the epitaxial layer may be formed to have a convex structure whose thickness increases with an inward distance from an edge of the epitaxial layer, or a concave structure whose thickness decreases with an inward distance from an edge of the epitaxial layer.

According to example embodiments of the inventive concept, a semiconductor memory device comprises a substrate, a gate stack vertically stacked on the substrate, wherein the gate stack comprises a plurality of insulating layers alternatingly stacked with a plurality of gates, a channel hole penetrating the gate stack, and a channel in the channel hole and electrically connected to the substrate at a lower portion of the channel and to a bit line at an upper portion of the channel, wherein the channel includes a semiconductor layer vertically extending along the channel hole to under a bottom surface of a lowermost gate of the gate stack without extending below a top surface of the substrate.

In example embodiments, the substrate may comprise an epitaxial layer in the substrate, and the epitaxial layer may contact a bottom surface of the channel.

In example embodiments, a top surface of the epitaxial layer may be positioned at or higher than the top surface of the substrate, and under the bottom surface of a lowermost gate of the gate stack.

In example embodiments, the lowermost insulating layer of the plurality of insulating layers may be an etch stop layer.

According to example embodiments of the inventive concept, an information processing system comprises a semiconductor memory device of an embodiment of the inventive concept wherein the information processing system is one of a mobile device, a desktop computer, an application chipset, a camera image sensor, a camera image signal processor, and an input/output device.

According to example embodiments of the inventive concept, a system for transmitting or receiving data comprises a memory device, and a processor in communication with the memory device, wherein the memory device comprises a substrate, a gate stack vertically stacked on the substrate, a channel hole penetrating the gate stack to the substrate, and a channel in the channel hole and electrically connected to the substrate, wherein the substrate comprises an epitaxial layer in the substrate below the channel hole, wherein a top surface of the epitaxial layer is positioned at or higher than a top surface of the substrate, and under a bottom surface of a lowermost gate of the gate stack.

In example embodiments, the system may comprises at least one of a mobile device, a desktop computer, an application chipset, a camera image sensor, a camera image signal processor, an input/output device, or a memory card.

According to example embodiments of the inventive concept, a semiconductor memory card comprises an interface part that interfaces with a host, a controller that communicates with the interface part and a memory device via a bus, wherein the memory device comprises a substrate, a gate stack vertically stacked on the substrate, wherein the gate stack comprises a plurality of insulating layers alternatingly stacked with a plurality of gates, a channel hole penetrating the gate stack, and a channel in the channel hole and electrically connected to the substrate at a lower portion of the channel and to a bit line at an upper portion of the channel, wherein the channel includes a semiconductor layer vertically extending along the channel hole to under a bottom surface of a lowermost gate of the gate stack without extending below a top surface of the substrate.

According to example embodiments of the inventive concept, a computer system comprises a semiconductor device having a circuit layout manufactured by a method of an embodiment of the inventive concept, wherein the computer system is one of a mobile device, a desktop computer, an application chipset, a camera image sensor, a camera image signal processor, and an input/output device.

According to example embodiments of the inventive concept, a system for transmitting or receiving data comprises a memory device for storing a program, and a processor in communication with the memory device, wherein the memory device comprises a circuit layout manufactured by a method of an embodiment of the inventive concept.

In example embodiments, the system may comprise at least one of a mobile device, a desktop computer, an application chipset, a camera image sensor, a camera image signal processor, an input/output device, or a memory card.

According to example embodiments of the inventive concept, a semiconductor memory card comprises an interface part that interfaces with a host, a controller that communicates with the interface part and a memory device via a bus, wherein the memory device comprises a circuit layout manufactured by a method of an embodiment of the inventive concept.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 7D is an enlarged sectional view illustrating a portion of FIG. 7C.

FIGS. 7E and 7F are sectional views illustrating modified examples of FIG. 7D.

Figure 1:
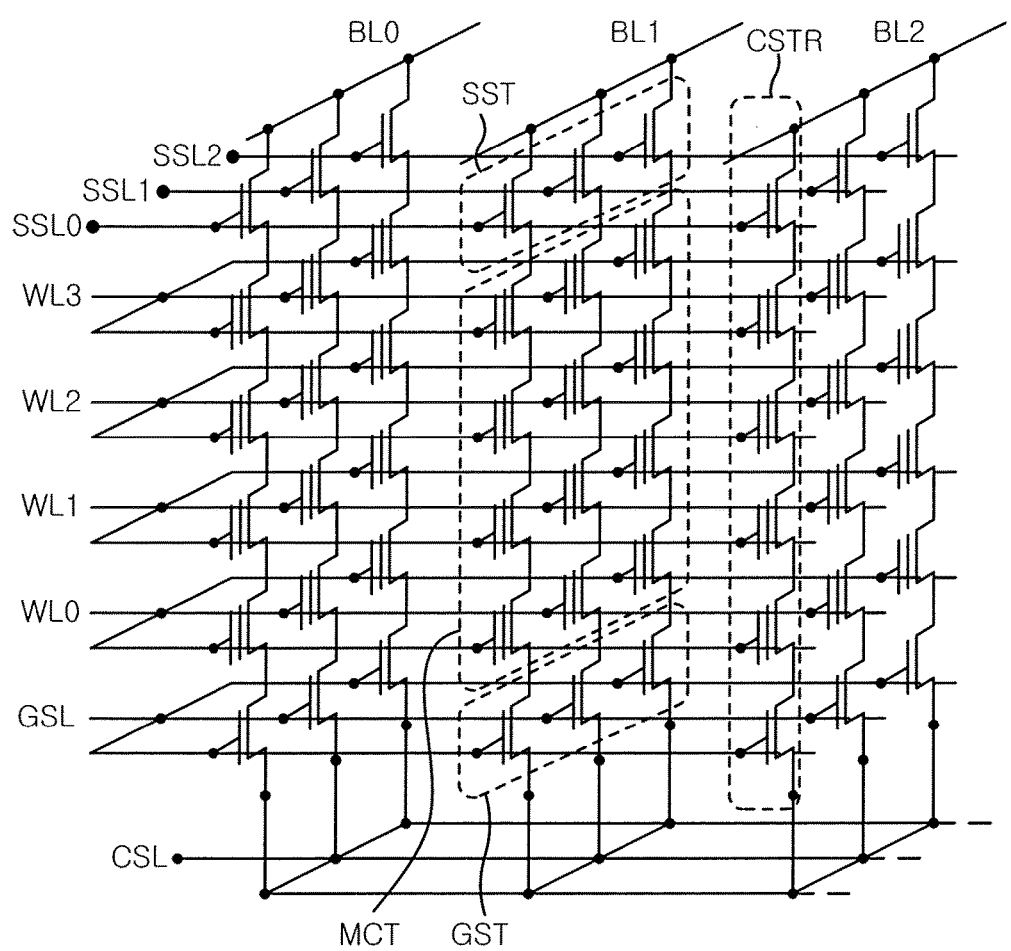
FIG. 1 is a circuit diagram of a semiconductor memory device according to example embodiments of the inventive concept.

It should be noted that these figures illustrate the general characteristics of methods, structure and/or materials utilized in certain example embodiments and supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings may indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions may be exaggerated for clarity. Like reference numerals in the drawings may denote like elements.

It will be understood that when an element is referred to as being "connected" or "coupled" to, or "on" another element, it can be directly connected or coupled to, or "on" the other element or intervening elements may be present. As used herein the term "and/or" includes any and all combinations of one or more of the associated listed items.

As used herein, the singular forms "a," "an" and "the" are intended to include the plural forms as well, unless the context clearly indicates otherwise.

Example embodiments of the inventive concepts should not be construed as limited to the particular shapes of regions illustrated herein but are to include deviations in shapes that result, for example, from manufacturing.

FIG. 1 is an equivalent circuit diagram of a semiconductor memory device according to example embodiments of the inventive concept.

Referring to FIG. 1, according to example embodiments of the inventive concept, a semiconductor memory device may include a common source line CSL, a plurality of bit lines BL0, BL1, and BL2, and a plurality of cell strings CSTR provided between the common source line CSL and the bit lines BL0-BL2. In accordance with embodiments of the inventive concept, the semiconductor memory device may be a three-dimensional NAND FLASH memory device.

The bit lines BL0-BL2 may be two-dimensionally arranged and the plurality of the cell strings CSTR may be connected in parallel to each of the bit lines BL0-BL2. The cell strings CSTR may be connected in common to the common source line CSL. In other words, the plurality of the cell strings CSTR may be disposed between the bit lines BL0-BL2 and the common source line CSL. In example embodiments, the common source line CSL includes a plurality of portions, which are two-dimensionally arranged. The portions of the common source line CSL can be applied with the same voltage. Alternatively, the portions of the common source line CSL can be independently controlled.

Each of the cell strings CSTR can include a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT can be connected in series.

In accordance with an embodiment of the inventive concept, the common source line CSL is connected in common to the ground selection transistors GST. The ground selection line GSL, the word lines WL0, WL2, WL2, and WL3, and the portions of the string selection line SSL, which are disposed between the common source line CSL and the bit lines BL0-BL2, can be used for gate electrodes of the ground selection transistor GST, the memory cell transistors MCT, and the string selection transistors SST, respectively. Each of the memory cell transistors MCT includes a data storing element (for example, formed of a charge-trapping insulating material).

The semiconductor memory device of the circuit diagram can be realized in various manners, as will be described below.

Figure 2A:
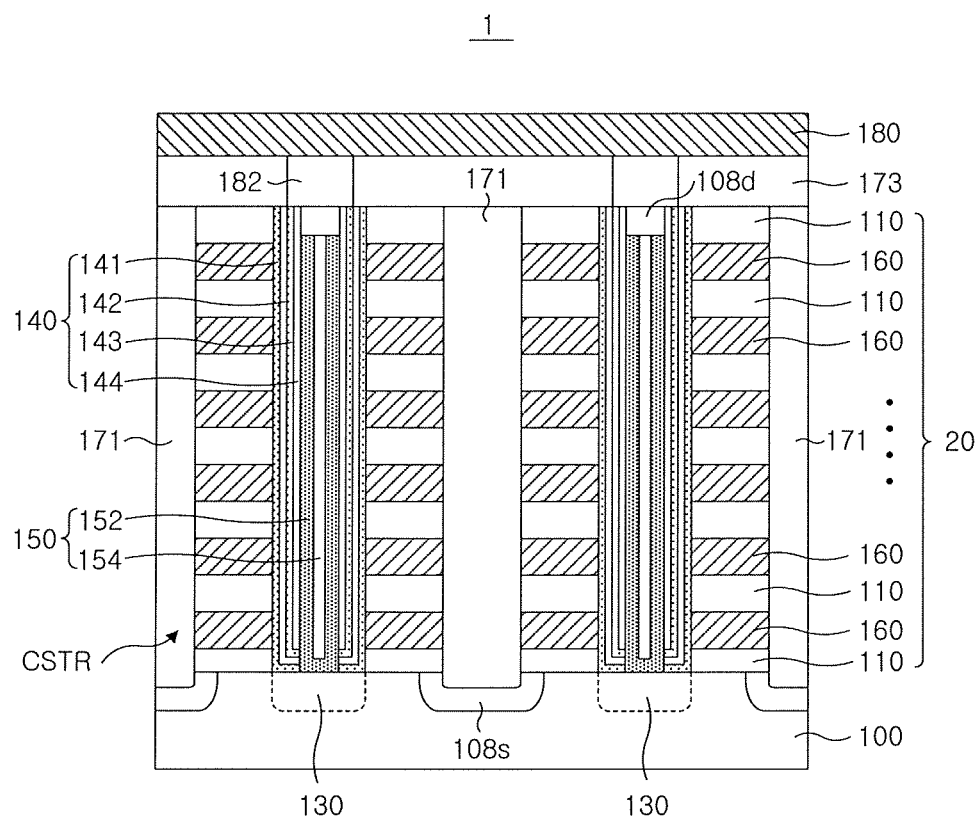
FIG. 2A is a sectional view of a semiconductor memory device according to an example embodiment of the inventive concept.
Figure 2B:
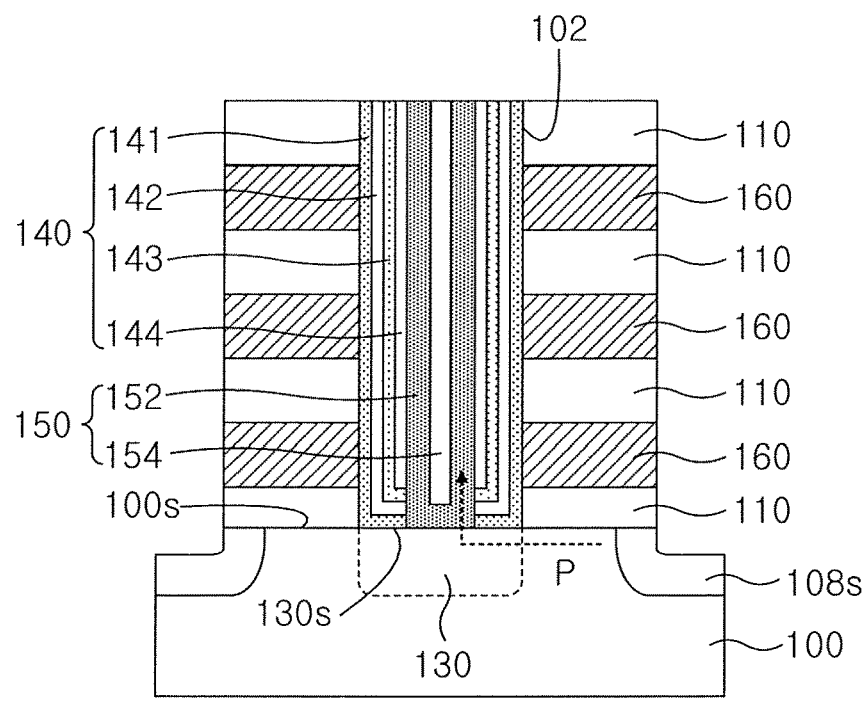
FIG. 2B is an enlarged sectional view illustrating a portion of FIG. 2A.

FIG. 2A is a sectional view of a semiconductor memory device according to an example embodiment of the inventive concept, and FIG. 2B is an enlarged sectional view illustrating a portion of FIG. 2A.

Referring to FIG. 2A, in accordance with an embodiment of the inventive concept, a semiconductor memory device 1 includes a substrate 100, a gate stack 20 disposed on the substrate 100, a vertical channel 150 penetrating the gate stack 20, a gate insulating layer stack 140 extending along a vertical direction and surrounding a sidewall of the vertical channel 150, and a bit line 180 electrically connected to the vertical channel 150. The semiconductor memory device 1 further includes an insulating gap-fill layer 171 disposed between the gate stacks 20, an interlayered insulating layer 173 provided between the gate stack 20 and the bit line 180, and a plug 182 penetrating the interlayered insulating layer 173 to connect the vertical channel 150 with the bit line 180.

In example embodiments, the substrate 100 can include a single crystalline silicon wafer, which may be doped to have a first conductivity type (for example, p-type). The substrate 100 can include a common source 108s provided below the insulating gap-fill layer 171. In accordance with an embodiment of the inventive concept, the common source 108s is doped to have a second conductivity type (for example, n-type), which may be different from that of the substrate 100. The common source 108s is formed to cross the bit line 180 (for example, orthogonally), thereby serving as the common source line CSL of FIG. 1.

In accordance with an embodiment of the inventive concept, the gate stack 20 includes mold insulating layers 110 and gates 160 alternatingly stacked along a longitudinal direction of the vertical channel 150 or a vertical direction. In example embodiments, the gate stack 20, the vertical channel 150 penetrating the gate stack 20, and the gate insulating layer stack 140 surrounding the sidewall of the vertical channel 150 constitute the cell string CSTR. Here, although FIG. 2A shows two cell strings CSTR connected in parallel to each of the bit lines 180, example embodiments of the inventive concept are not limited thereto. In accordance with an embodiment of the inventive concept, the lowermost one of the gates 160 serves as the ground selection line GSL (see, FIG. 1) for controlling an electric connection between the common source 108s and the vertical channel 150, and the upper most one of the gates 160 serves as the string selection lines SSL0-SSL2 (see, FIG. 1) for controlling an electric connection between the bit line 180 and the vertical channel 150, and the others of the gates 160 serve as word lines WL0-WL3 (see, FIG. 1) for controlling memory cells. In accordance with an embodiment of the inventive concept, the gates 160 extend along a first horizontal direction (for example, front and rear direction), and the bit line 180 extends along a second horizontal direction (for example, right and left direction), which may be substantially perpendicular or perpendicular to the first horizontal direction.

In accordance with an embodiment of the inventive concept, the vertical channel 150 includes a lower portion electrically connected to the substrate 100 and an upper portion electrically connected to the bit line 180. The vertical channel 150 cam include a semiconductor layer 152 shaped like a pipe or cylinder and an inner insulating layer 154 filling an inner space of the semiconductor layer 152. In example embodiments, the semiconductor layer 152 may be shaped like a cylinder with a bottom portion connected to the substrate 100. For example, in accordance with an embodiment of the inventive concept, the cylinder may have a closed bottom-portion connected to the substrate 100. The cylindrical structure of the vertical channel 150 can enable formation of a thin channel having a low density of a charge trap site. The semiconductor layer 152 can include a single or poly crystalline silicon layer. In example embodiments, the semiconductor layer 152 can be undoped or doped to have the same conductivity type (for example, p-type) as the substrate 100. In accordance with an embodiment of the inventive concept, an uppermost portion of the vertical channel 150 is used as a drain 108d connected to the bit line 180 through the plug 182. The drain 108d can be doped to have the same conductivity type (for example, n-type) as the common source 108s.

Referring to FIG. 2B in conjunction with FIG. 2A, a channel hole 102 expose a top surface 100s of the substrate 100 through the gate stack 20, and the gate insulating layer stack 140 is vertically provided in the channel hole 102. The gate insulating layer stack 140 can serve as a memory layer including a data storing insulating material. For example, when a high voltage is applied between the gate 160 and the vertical channel 150, electric charges can be trapped in the data storing insulating material, for example, through Fowler-Nordheim tunneling. In example embodiments, the gate insulating layer stack 140 includes a tunnel insulating layer 144 vertically extending along the sidewall of the vertical channel 150, blocking insulating layers 141 and 142 vertically extending along an inner sidewall of the channel hole 102, and a trap insulating layer 143 interposed between the blocking insulating layers 141 and 142 and the tunnel insulating layer 144. In accordance with an embodiment of the inventive concept, the trap insulating layer 143 further includes conductive nanodots. The blocking insulating layers 141 and 142 can be a double-layered structure including a first blocking insulating layer 141 adjacent to the inner sidewall of the channel hole 102 and a second blocking insulating layer 142 disposed between the first blocking insulating layer 141 and the trap insulating layer 143. In other embodiments, the gate insulating layer stack 140 includes a memory layer (e.g., a phase-change layer or a variable resistance layer), whose memory operation is executed based on a mechanism different from Fowler-Nordheim tunneling. As a result of the gate insulating layer stack 140 being provided in the channel hole 102, the gate stack 20 has a reduced height, compared with the case when the gate insulating layer stack 140 is provided between the gates 160 and the mold insulating layers 110.

In accordance with an embodiment of the inventive concept, the substrate 100 further includes an epitaxial layer 130 provided below the channel hole 102 and electrically connected to the vertical channel 150. In accordance with an embodiment of the inventive concept, the epitaxial layer 130 is formed of the same material as the substrate 100 by an epitaxial process. For example, the epitaxial layer 130 can include a single crystalline silicon layer, whose crystal axis is oriented to have the same direction as or a direction slightly deviated from that of the substrate 100. In example embodiments, a top surface 130s of the epitaxial layer 130 is coplanar or substantially coplanar with the top surface 100s of the substrate 100. In accordance with an embodiment of the inventive concept, a portion of the substrate 100 below the channel hole 102 is not recessed, and thus, the gate insulating layer stack 140 and the vertical channel 150 do not extend below the top surface 100s of the substrate 100. Accordingly, it is possible to prevent a current path and an electric resistance between the common source 108s and the vertical channel 150 from increasing. In other words, since the gate insulating layer stack 140 does not penetrate into the substrate 100, it is possible to realize a short current path P between the common source 108s and the vertical channel 150. In example embodiments, the epitaxial layer 130 does not protrude from the top surface 100s of the substrate 100, and thus, the epitaxial layer 130 does not overlap the lowermost gate 160 in the second horizontal direction (or the right and left direction). Accordingly, it is possible to omit a step of forming a gate insulating layer between the epitaxial layer 130 and the lowermost gate 160.

In the case where the bottom surface of the channel hole 102 is coplanar with the top surface 100s of the substrate 100, the epitaxial layer 130 shown in FIG. 2B can be omitted. In other words, according to an embodiment of the inventive concept, it is possible to omit the step of forming the epitaxial layer 130 shown in FIG. 2B, if the substrate 100 is not recessed during the formation of the channel hole 102.

In accordance with an embodiment of the inventive concept, at least one of the insulating layers 141-144 of the gate insulating layer stack 140 has an 'L'-shaped section including a vertical portion vertically extending along the vertical channel 150 and a horizontal portion horizontally extending along the top surface 130s of the epitaxial layer 130 to cover an edge portion of a bottom surface of the channel hole 102 and/or a portion of the epitaxial layer 130. For example, each of the blocking insulating layer 141 and 142 and the trap insulating layer 143 can have a lower portion, whose vertical section is shaped like a letter 'L'. In accordance with an embodiment of the inventive concept, the tunnel insulating layer 144 can be a linear (e.g., pipe-shaped) structure or a structure with an 'L'-shaped lower portion. In accordance with an embodiment of the inventive concept, the lowermost layer of the mold insulating layers 110 has a vertical thickness less than a vertical thickness of the next lowermost mold insulating layer 110. In accordance with an embodiment of the inventive concept, a vertical thickness of the lowermost layer of the mold insulating layers 110 is equivalent to or greater than a horizontal thickness of the gate insulating layer stack 140. A leakage current between the lowermost gate 160 and the substrate 100 can be suppressed or reduced by the 'L'-shaped portion of the gate insulating layer stack 140 and/or a difference in thickness between the mold insulating layer 110 and the gate insulating layer stack 140. Depending on the process conditions in steps of depositing and patterning the gate insulating layer stack 140, a horizontal width of the vertical channel 150 may be uniform as shown in FIG. 2B, or not uniform as described with reference to FIGS. 3A through 3C.

FIGS. 3A through 3E are sectional views illustrating alternative examples of FIG. 2B.

Figure 3A:
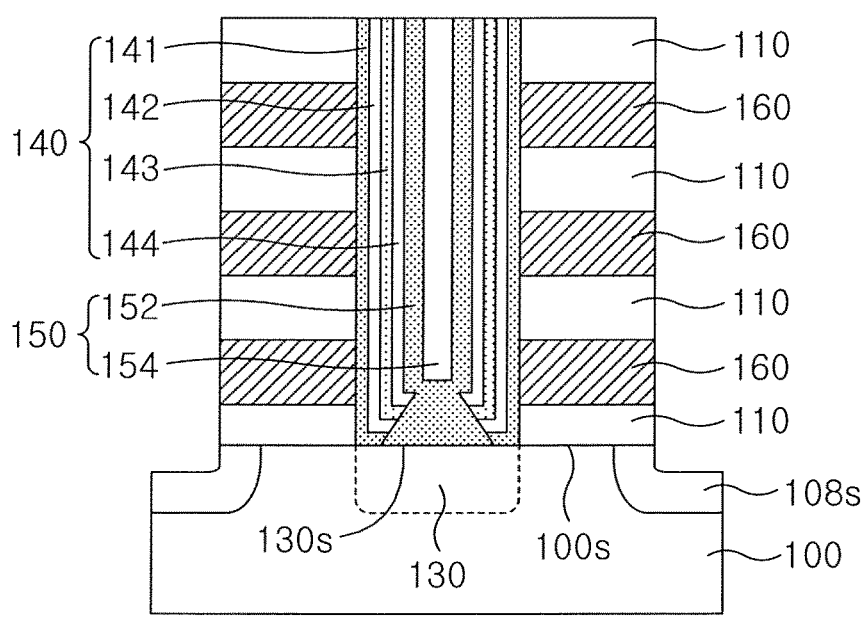
FIGS. 3A through 3E are sectional views illustrating alternative examples of FIG. 2B.

Referring to FIG. 3A, the gate insulating layer stack 140 has a lower portion, whose width decreases with decreasing distance from the top surface 100s of the substrate 100. The vertical channel 150 has a structure, whose width increases with decreasing distance from the top surface 100s of the substrate 100.

Figure 3B:
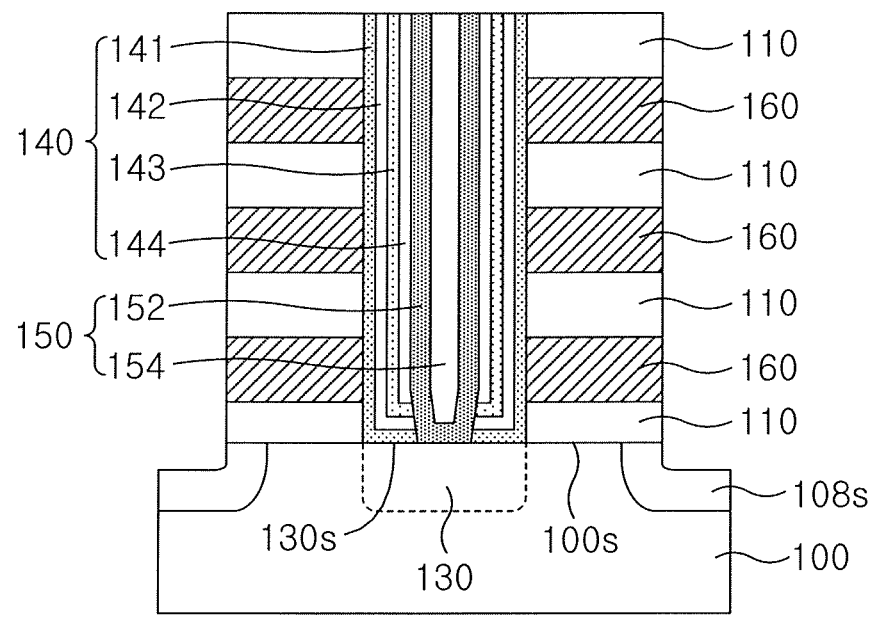

Referring to FIG. 3B, the gate insulating layer stack 140 has a lower portion, whose width increases with decreasing distance from the top surface 100s of the substrate 100. The vertical channel 150 has a structure, whose width decreases with decreasing distance from the top surface 100s of the substrate 100.

Figure 3C:
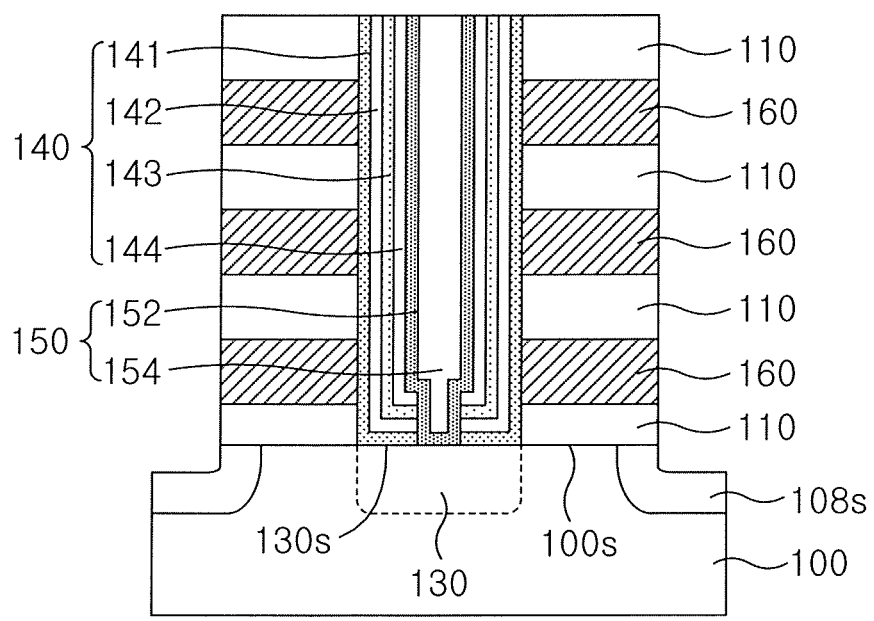

Referring to FIG. 3C, each of the insulating layers 141-144 of the gate insulating layer stack 140 has an 'L'-shaped lower portion. The vertical channel 150 has a lower portion, which is adjacent to the 'L'-shaped lower portions of the insulating layers 141-144 and has a width smaller than that of an upper portion of the vertical channel 150.

Figure 3D:
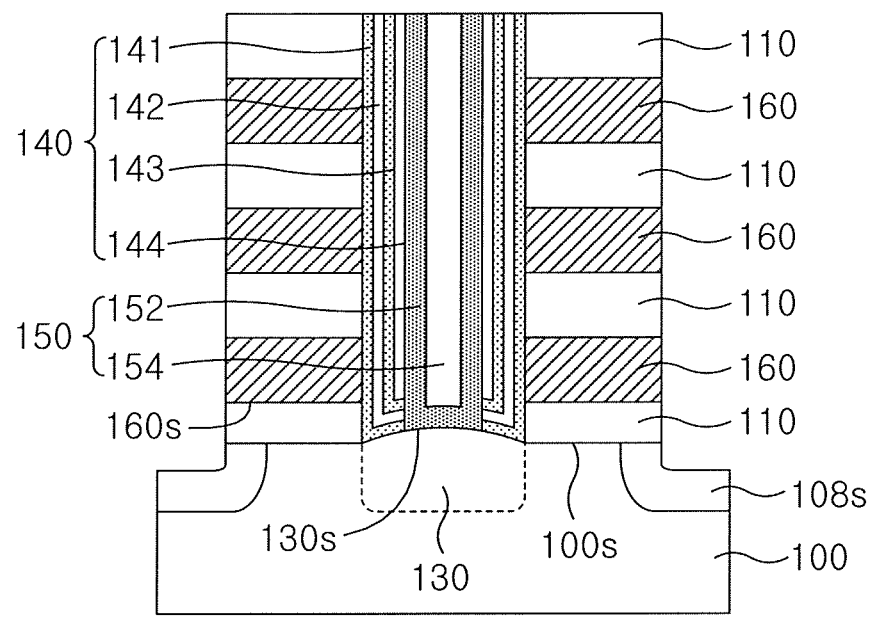

Referring to FIG. 3D, the epitaxial layer 130 protrudes from the top surface 100s of the substrate 100. For example, in accordance with an embodiment of the inventive concept, the epitaxial layer 130 has an arc-shaped top surface 130s, which is higher than the top surface 100s of the substrate 100 but lower than a bottom surface 160s of the lowermost gate 160. In accordance with an embodiment of the inventive concept, the top surface 130s of the epitaxial layer 130 has the arc shape protruding concavely toward the top surface 100s of the substrate 100. In example embodiments, the epitaxial layer 130 may not fill the lower portion of the channel hole 102. Even if the epitaxial layer 130 fills the lower portion of the channel hole 102, the lowermost gate 160 and the epitaxial layer 130 do not overlap and are not connected with each other in the right and left direction or in an extending direction of the bit line 180. Accordingly, a gate insulating layer for electrically separating the lowermost gate 160 from the epitaxial layer 130 can be omitted. In the embodiment described in connection with FIG. 3D, shapes or structures of the gate insulating layer stack 140 and the vertical channel 150 may be modified, as exemplarily shown in FIGS. 3A through 3C, but are not limited thereto.

Figure 3E:
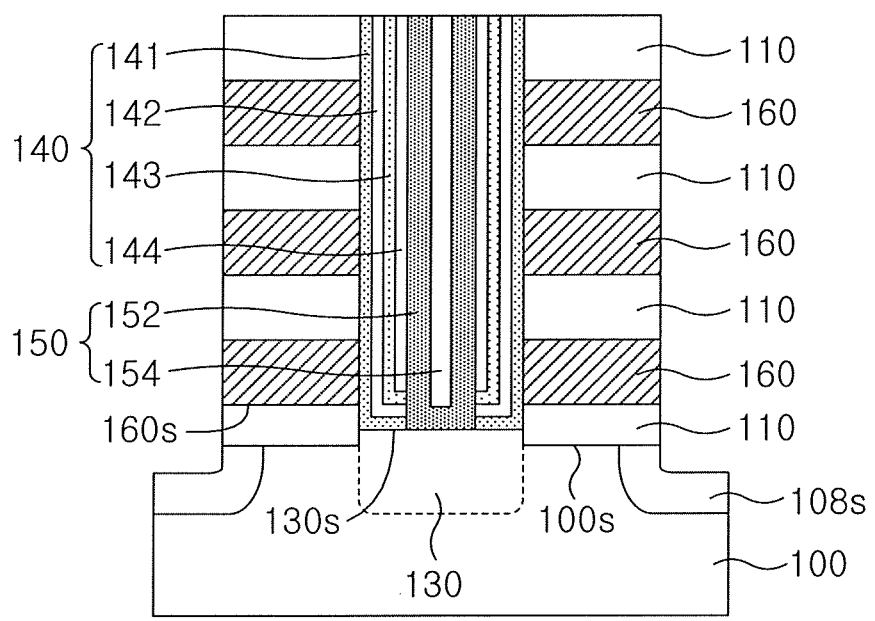

Referring to FIG. 3E, the epitaxial layer 130 has a substantially flat top surface 130s, which is higher than the top surface 100s of the substrate 100 but lower than the bottom surface 160s of the lowermost gate 160. In other embodiments, the epitaxial layer 130 may have an arc-shaped structure as shown in FIG. 3D. In the embodiment described in connection with FIG. 3E, shapes or structures of the gate insulating layer stack 140 and the vertical channel 150 may be variously modified, as exemplarily shown in FIGS. 3A through 3C, but are not limited thereto.

Figure 4A:
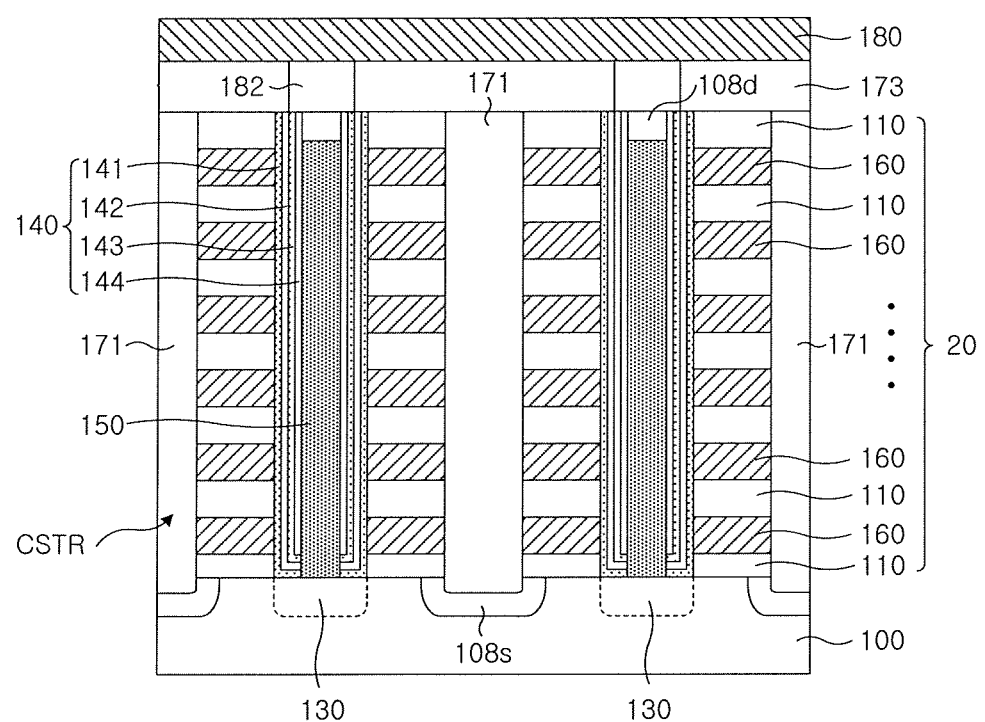
FIG. 4A is a sectional view of a semiconductor memory device according to an example embodiment of the inventive concept.
Figure 4B:
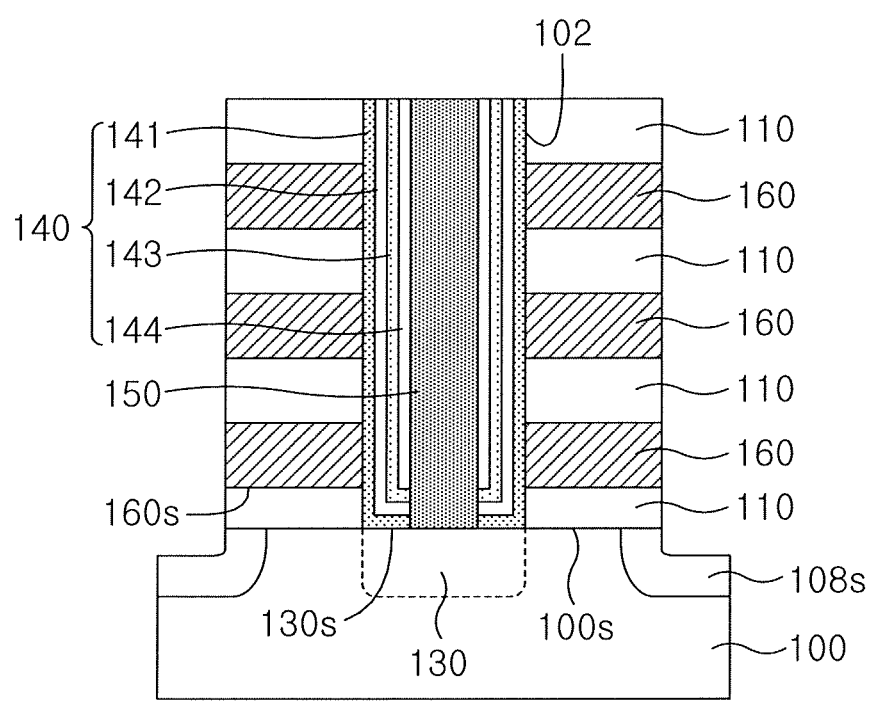
FIG. 4B is an enlarged sectional view illustrating a portion of FIG. 4A.

FIG. 4A is a sectional view of a semiconductor memory device according to an example embodiment of the inventive concept, and FIG. 4B is an enlarged sectional view illustrating a portion of FIG. 4A.

Referring to FIG. 4A, a semiconductor memory device 2 includes the vertical channel 150 vertically standing on the substrate 100, the gate insulating layer stack 140 extending in a vertical direction to surround the vertical channel 150, the gate stack 20 including the gates 160 vertically spaced apart from each other by the mold insulating layers 110, and the bit line 180 electrically connected to the vertical channel 150. The substrate 100 can include the common source 108s provided between the gate stacks 20 adjacent to each other. The vertical channel 150 includes a lower portion electrically connected to the substrate 100 through the gate insulating layer stack 140. An upper portion of the vertical channel 150 includes the drain 108d electrically connected to the bit line 180 via the plug 182. Adjacent gate stacks 20 can be spaced apart from each other by the insulating gap-fill layer 171. The gate stacks 20 can be spaced apart from the bit line 180 by the interlayered insulating layer 173.

Referring to FIG. 4B in conjunction with FIG. 4A, according to an embodiment, the vertical channel 150 is a solid pillar structure electrically connected to the substrate 100 and formed of a semiconductor layer. In accordance with an embodiment of the inventive concept, the substrate 100 further includes the epitaxial layer 130 coupled to the vertical channel 150. The gate insulating layer stack 140 can include the tunnel insulating layer 144, the trap insulating layer 143, and the double-layered blocking insulating layers 141 and 142. At least one of the insulating layers 141-144 of the gate insulating layer stack 140 can have an 'L'-shaped lower portion partially covering the edge portion of the bottom surface of the channel hole 102 or an edge portion of the epitaxial layer 130. In the embodiment described in connection with FIGS. 4A and 4B, shapes of the gate insulating layer stack 140 and the vertical channel 150 may be modified as shown in FIGS. 3A through 3C, but are not limited thereto. The top surface 130s of the epitaxial layer 130 may be coplanar with the top surface 100s of the substrate 100. Alternatively, as exemplarily shown in FIGS. 3D and 3E, the top surface 130s of the epitaxial layer 130 protrudes upward from the top surface 100s of the substrate 100. In this case, the top surface 130s of the epitaxial layer 130 is positioned at a level lower than the bottom surface 160s of the lowermost gate 160. In an alternative embodiment, the epitaxial layer 130 is not provided if the channel hole 102 is not recessed below the top surface 100s of the substrate 100.

Figure 5A:
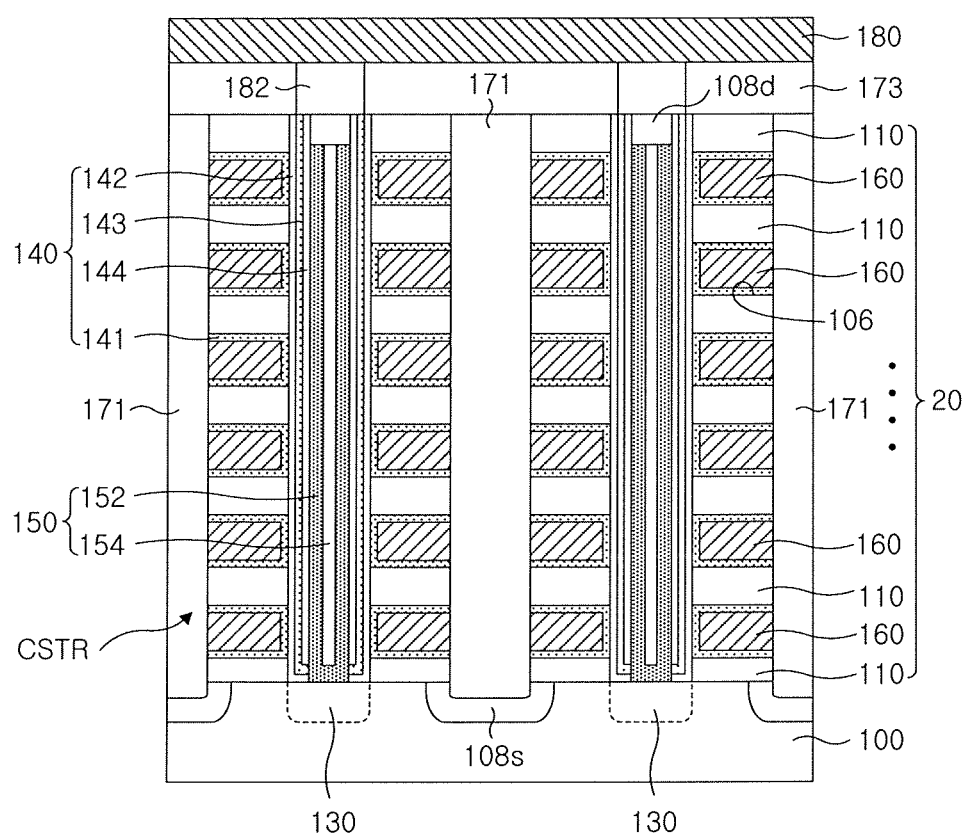
FIG. 5A is a sectional view of a semiconductor memory device according to an example embodiment of the inventive concept.
Figure 5B:
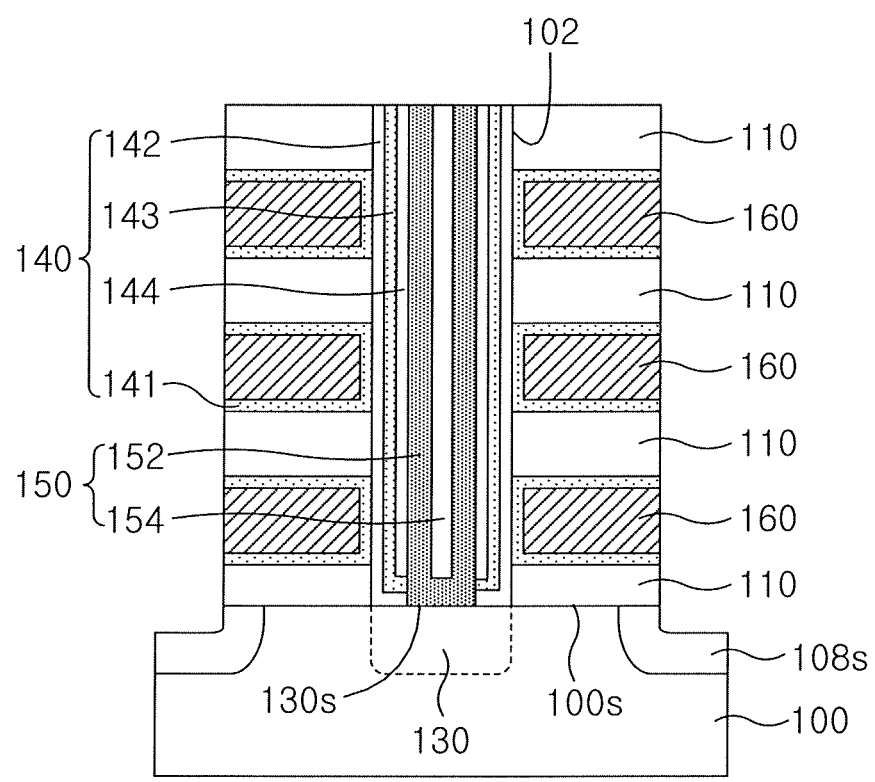
FIG. 5B is an enlarged sectional view illustrating a portion of FIG. 5A.

FIG. 5A is a sectional view of a semiconductor memory device according to an example embodiment of the inventive concept, and FIG. 5B is an enlarged sectional view illustrating a portion of FIG. 5A.

Referring to FIG. 5A, a semiconductor memory device 3 includes the vertical channel 150 which vertically stands on the substrate 100 and has a lower portion electrically connected to the substrate 100, the gate stack 20 including the gates 160 vertically spaced apart from each other by the mold insulating layers 110, and the bit line 180 electrically connected to the drain 108d provided in an upper portion of the vertical channel 150 via the plug 182. The substrate 100 can include the common source 108s provided between adjacent gate stacks 20. The adjacent gate stacks 20 can be spaced apart from each other by the insulating gap-fill layer 171. The gate stacks 20 can be spaced apart from the bit line 180 by the interlayered insulating layer 173.

Referring to FIG. 5B in conjunction with FIG. 5A, the vertical channel 150 includes, for example, a cylindrical semiconductor layer 152 with the closed bottom portion, and the inner insulating layer 154 surrounded by the semiconductor layer 152. Alternatively, the vertical channel 150 can be provided in the form of solid pillar structure as shown in FIG. 4B. Some layers of the gate insulating layer stack 140 are configured to surround the gates 160, while other layers of the gate insulating layer stack 140 are configured to surround the vertical channel 150. For example, the first blocking insulating layer 141 covers top and bottom surfaces and one of the side surfaces of the gate 160 or has a folded structure, while the second blocking layer 142, the trap insulating layer 143, and the tunnel insulating layer 144 extend along the vertical direction and cover the sidewall of the vertical channel 150. In the embodiment described in connection with FIGS. 5A and 5B, shapes of the gate insulating layer stack 140 and the vertical channel 150 may be modified as exemplarily shown in FIGS. 3A through 3C, but are not limited thereto. The semiconductor memory device 3 can further include the epitaxial layer 130 provided in the substrate 100 below the channel hole 102. The top surface 130s of the epitaxial layer 130 can be coplanar with the top surface 100s of the substrate 100. Alternatively, as exemplarily shown in FIGS. 3D and 3E, the top surface 130s of the epitaxial layer 130 protrudes upward from the top surface 100s of the substrate 100. In accordance with an embodiment of the inventive concept, the substrate 100 does not include the epitaxial layer 130 if the channel hole 102 is not recessed below the top surface 100s of the substrate 100.

Figure 6A:
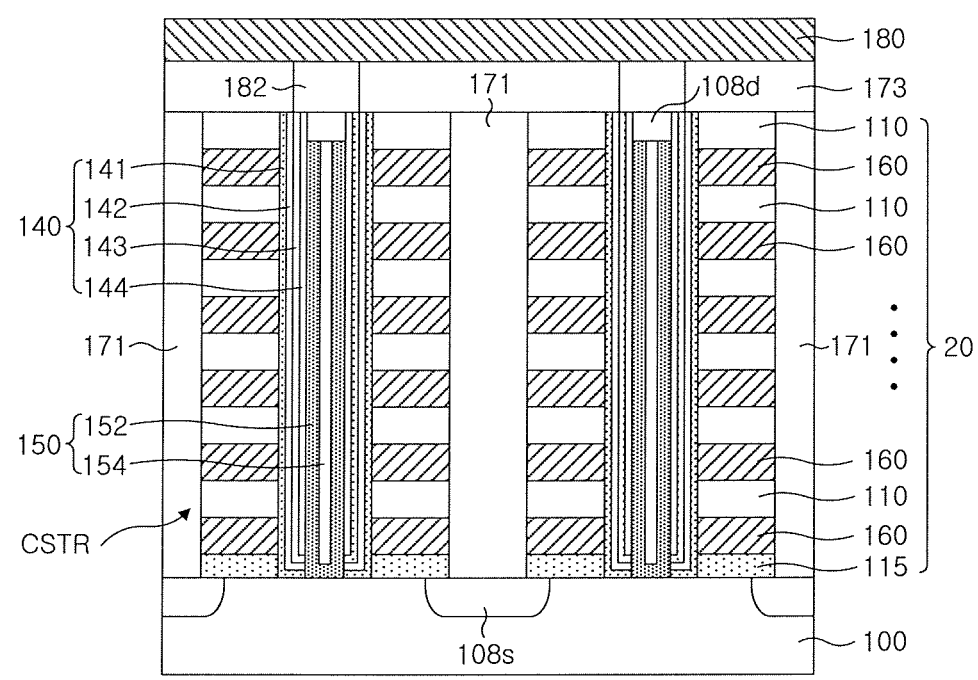
FIG. 6A is a sectional view of a semiconductor memory device according to an example embodiment of the inventive concept.
Figure 6B:
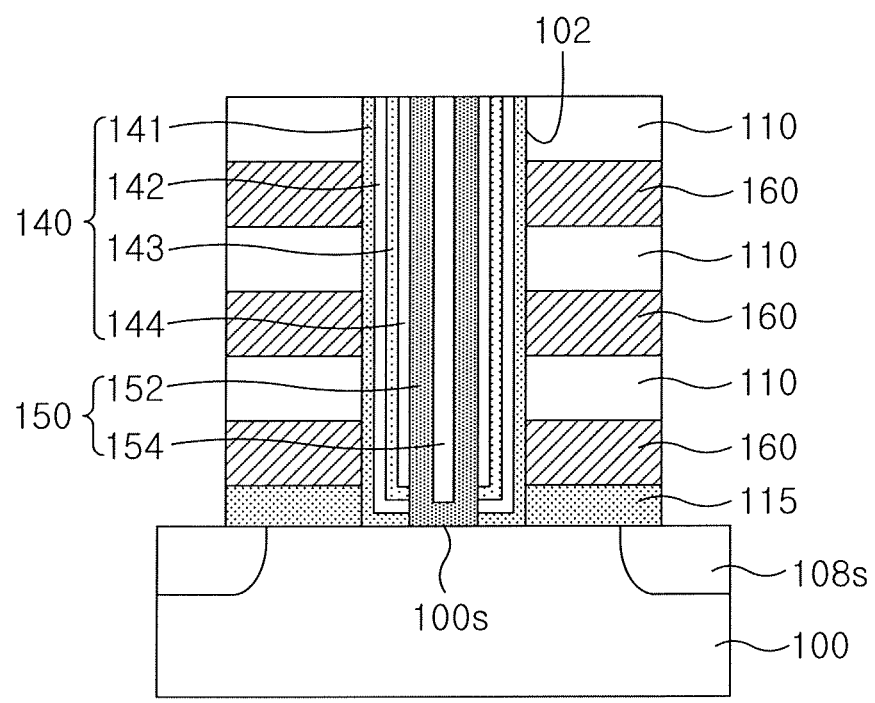
FIG. 6B is an enlarged sectional view illustrating a portion of FIG. 6A.

FIG. 6A is a sectional view of a semiconductor memory device according to an example embodiment of the inventive concept, and FIG. 6B is an enlarged sectional view illustrating a portion of FIG. 6A.

Referring to FIG. 6A, a semiconductor memory device 4 includes the vertical channel 150 vertically standing on the substrate 100, the gate insulating layer stack 140 extending in a vertical direction to surround the vertical channel 150, the gate stack 20 including the gates 160 vertically spaced apart from each other along the extending direction of the vertical channel 150, and the bit line 180 provided on the gate stack 20. The vertical channel 150 includes a lower portion electrically connected to the substrate 100 and an upper portion electrically connected to the bit line 180. The common source 108s can be provided in the substrate 100 between adjacent gate stacks 20, and the drain 108d can be provided in an upper portion of the vertical channel 150 and be connected with the plug 182. The adjacent gate stacks 20 can be spaced apart from each other by the insulating gap-fill layer 171, and the gate stacks 20 can be spaced apart from the bit line 180 by the interlayered insulating layer 173.

Referring to FIG. 6B in conjunction with FIG. 6A, the vertical channel 150 includes, for example, the cylindrical semiconductor layer 152 with a closed bottom portion and the inner insulating layer 154 surrounded by the semiconductor layer 152. Alternatively, the vertical channel 150 can be a solid pillar structure as shown in FIG. 4B. In the embodiment described in connection with FIGS. 5A and 5B, shapes of the gate insulating layer stack 140 and the vertical channel 150 may be modified as shown in FIGS. 3A through 3C, but are not limited thereto. In accordance with an embodiment of the inventive concept, the gate stack 20 includes an etch stop layer 115. For example, the gate stack 20 includes the etch stop layer 115, which is disposed on the top surface 100s of the substrate 100, and the mold insulating layers 110 and the gates 160 alternatingly stacked on the etch stop layer 115. According to an embodiment, due to the presence of the etch stop layer 115, it is possible to prevent the top surface 100s of the substrate 100 from being recessed during the formation of the channel hole 102. In this case, there is no need to compensate for a recess in the substrate 100, and thus, the formation of the epitaxial layer 130 may be omitted.

FIGS. 7A through 7M are sectional views illustrating a method of fabricating a semiconductor memory device according to an example embodiment of the inventive concept. FIG. 7D is an enlarged sectional view illustrating a portion of FIG. 7C, and FIGS. 7E and 7F are sectional views illustrating modified examples of FIG. 7D.

Figure 7A:
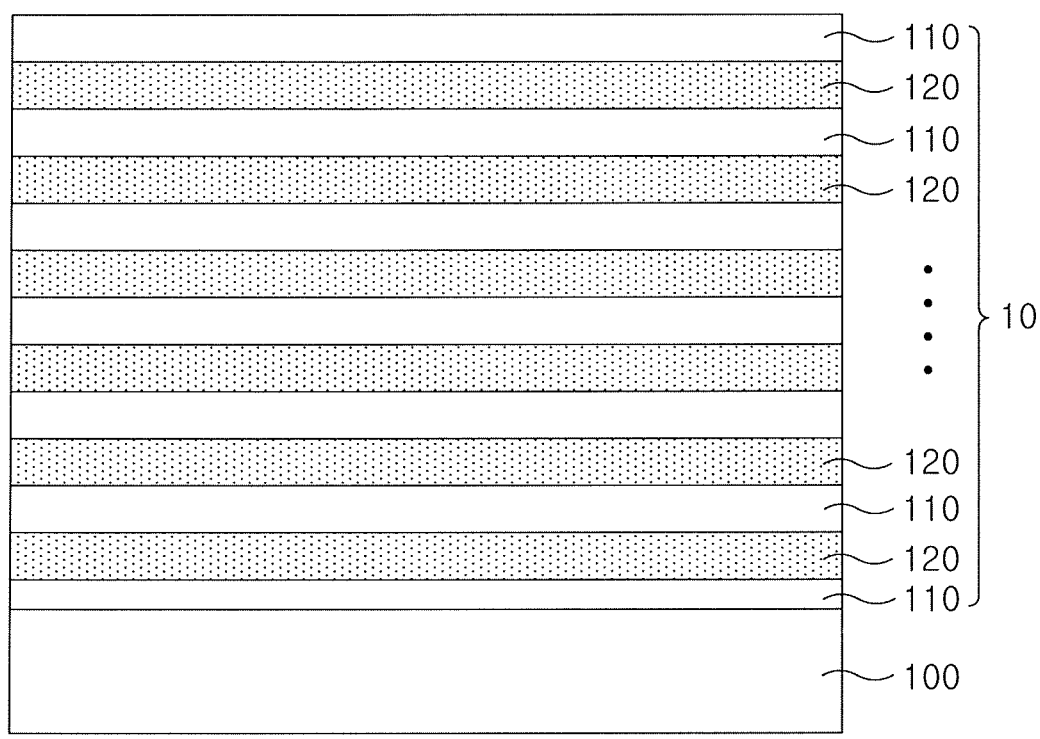
FIGS. 7A through 7M are sectional views illustrating a method of fabricating a semiconductor memory device according to an example embodiment of the inventive concept.

Referring to FIG. 7A, a mold stack 10 is formed on the substrate 100. The substrate 100 can include a semiconductor material, for example, a single crystalline silicon wafer. The substrate 100 can be doped to have the first conductivity type (for example, p-type). The mold stack 10 is formed by alternatingly stacking the mold insulating layers 110 and mold sacrificial layers 120 having etch selectivity with respect to the mold insulating layers 110. For example, the mold insulating layers 110 can include at least one of a silicon oxide layer, a silicon oxynitride layer, a silicon nitride layer, or a silicon carbide layer. The mold sacrificial layers 120 can include at least one material, which is selected from the group consisting of the silicon oxide layer, the silicon oxynitride layer, the silicon nitride layer, and the silicon carbide layer, but is different from the material of mold insulating layers 110. In example embodiments, the mold insulating layers 110 can be, for example, a silicon oxide layer formed using a deposition technique, and the mold sacrificial layers 120 can be, for example, a silicon nitride layer formed using a deposition technique. The mold insulating layers 110 can have the same thickness as each other, or at least two mold insulating layers 110 can have different thicknesses from each other. For example, the lowermost one of the mold insulating layers 110 can be thinner than the remaining mold insulating layers 110. Similarly, the mold sacrificial layers 120 can have the same thickness as each other, or at least two mold sacrificial layers 120 can have different thicknesses from each other.

Figure 7B:
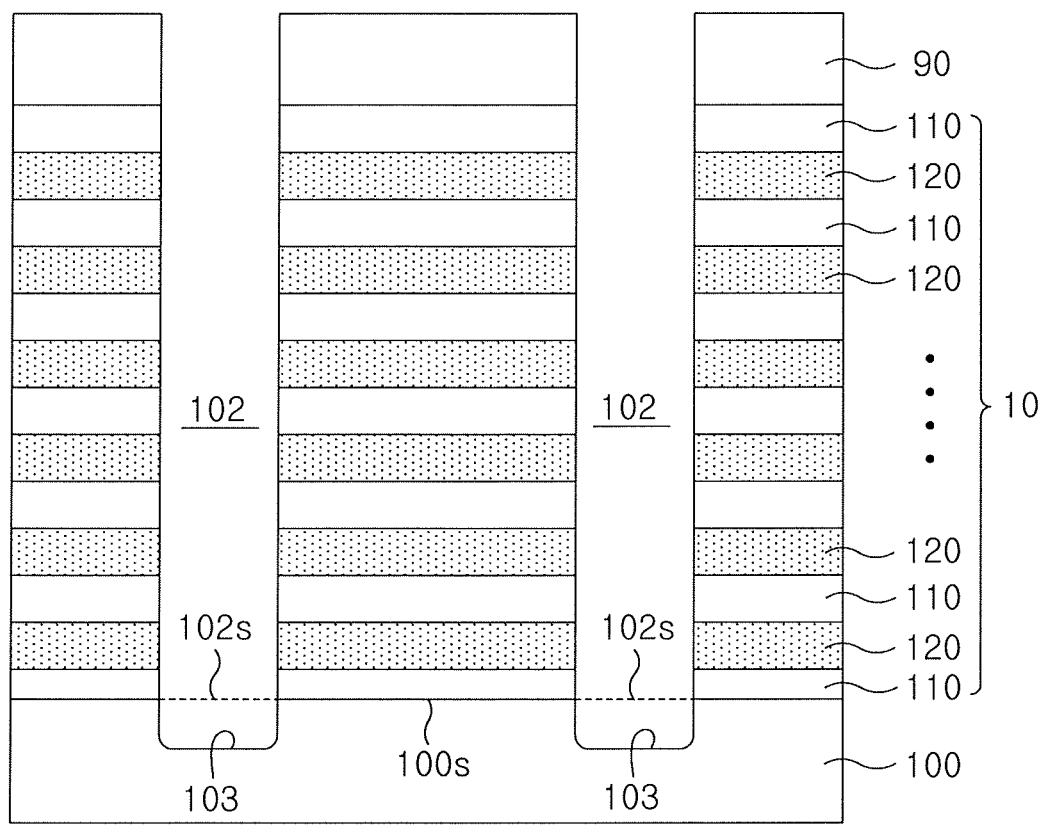

Referring to FIG. 7B, a mask 90 is formed on the mold insulating layers 110 and the mold sacrificial layers, and the mold stack 10 is patterned by an anisotropic etching process using the mask 90. As the result of the patterning process, the channel hole 102 is formed and penetrates the mold stack 10. The mask 90 can be a photoresist pattern, which is formed by a lithography process. Due to a variation in etch depth during the anisotropic etching process, the channel hole 102 may have a bottom surface 102s positioned at a level equivalent to or different from the top surface 100s of the substrate 100. In the case where the bottom surface 102s of the channel hole 102 is higher than the top surface 100s of the substrate 100, the vertical channel 150, which is described with reference to FIG. 7M, may not be electrically connected to the substrate 100. By contrast, in the case where the bottom surface 102s of the channel hole 102 is lower than the top surface 100s of the substrate 100, the gate insulating layer stack 140, which is described with reference to FIG. 7M, would \penetrate below the top surface 100s of the substrate 100, and as a result, a current path between the common source 108s (see FIG. 7M) and the vertical channel 150 would be increased. In example embodiments, the substrate 100 can be over-etched to avoid the above-noted variations in etch depth. As a result, the substrate 100 below the channel hole 102 is partially removed to form a recess region 103. The formation of the recess region 103 can be performed using the anisotropic etching process for forming the channel hole 102. Alternatively, the formation of the recess region 103 can include an anisotropic or isotropic etching step, which can be performed after the formation of the channel hole 102.

Figure 7C:
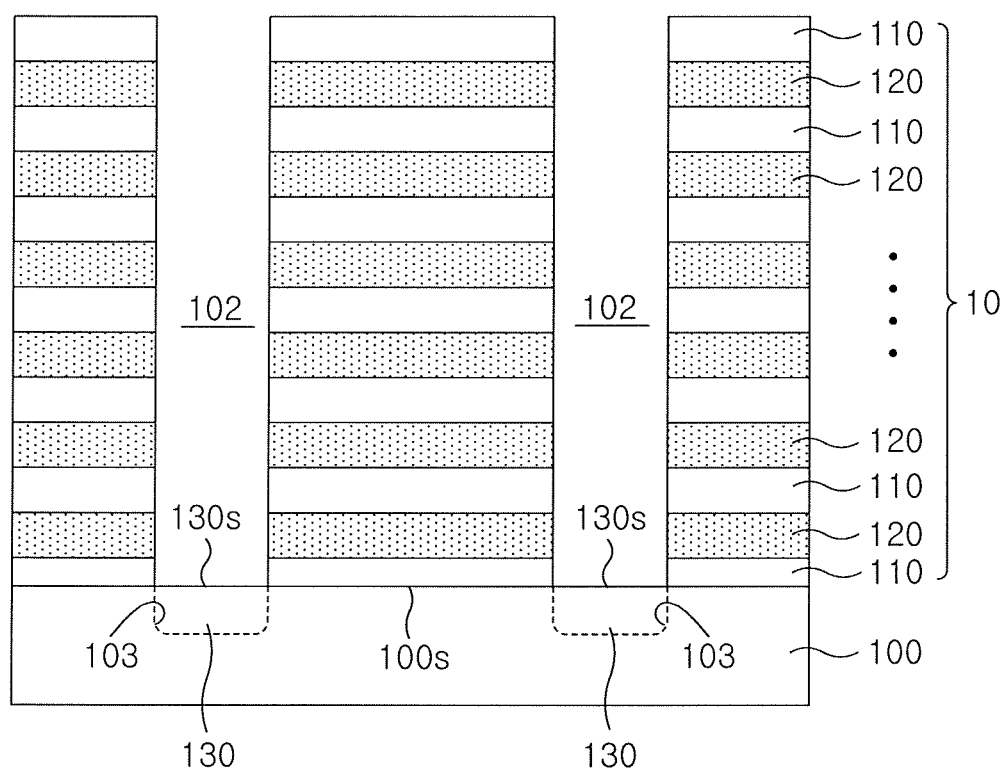
Figure 7D:
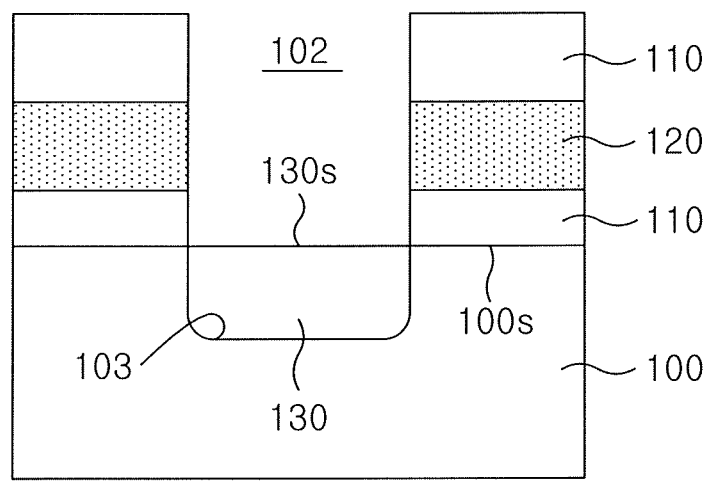
Figure 7E:
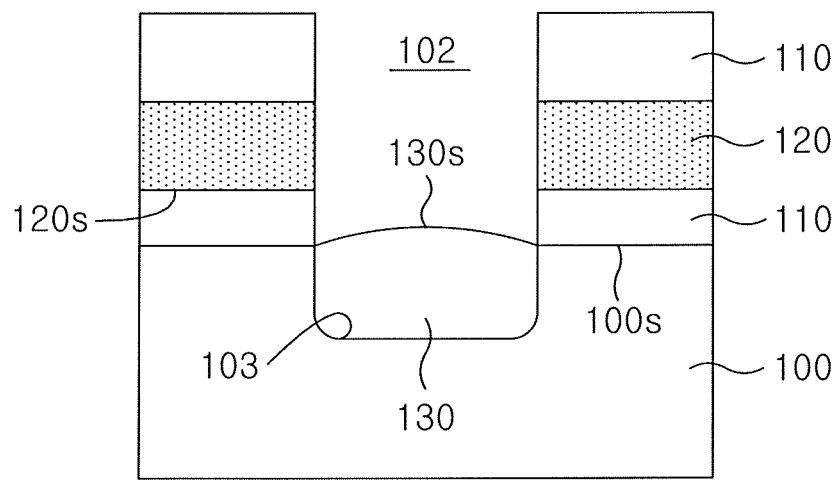
Figure 7F:
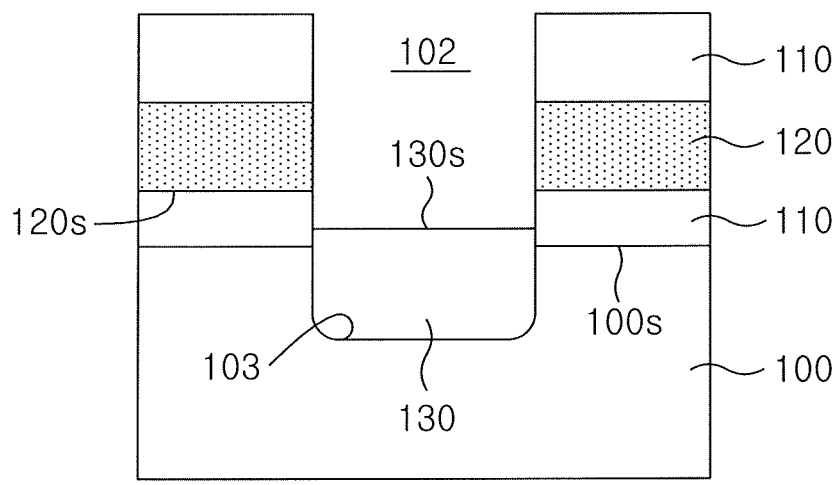

Referring to FIG. 7C, the recess region 103 is filled with the epitaxial layer 130. In example embodiments, the formation of the epitaxial layer 130 includes supplying a reaction gas, in which a silicon source gas (for example, containing at least one of $SiCl_4$, $SiH_2Cl_2$, $Si_2H_6$, $Si_3H_8$, $SiH_3Cl$, or $SiHCl_3$) and a hydrogen gas are mixed, onto the substrate 100 at a temperature of about 1000° C. (for example, about 1200° C.). Silicon atoms in the reaction gas are decomposed through a chemical reaction (for example, $SiCl_4 + 2H_2 \leftrightarrows Si + 4HCl$) and deposited on a surface of the substrate 100 exposed by the recess region 103 to form the epitaxial layer 130. Alternatively, the formation of the epitaxial layer 130 can include at least one silicon depositing step and at least one HCl etching step. In accordance with an embodiment of the inventive concept, the epitaxial layer 130 is formed to have a crystal axis, which is oriented to have the same direction as or a direction slightly deviated from a crystal axis of the substrate 100. The epitaxial layer 130 can include a single crystalline silicon layer. In other embodiments, the epitaxial layer 130 can be formed of a poly silicon layer. A dopant gas (e.g., containing $B_2H_6$) can be further supplied during the formation of the epitaxial layer 130, and thus, the epitaxial layer 130 can have the same conductivity type (for example, p-type) as the substrate 100. The dopant gas can be supplied along with the silicon source gas to form the doped epitaxial layer 130. In other embodiments, the dopant gas is supplied after the formation of the epitaxial layer 130. The epitaxial layer 130 can be formed by one of various epitaxial techniques (for example, a vapor phase epitaxy, a liquid phase epitaxy, a molecular beam epitaxy, or a solid phase epitaxy).

Referring to FIG. 7D, a growth speed of silicon can be greater on the substrate 100 exposed by the recess region 103 than on the mold insulating layer 110. As a result, the epitaxial layer 130 can be locally formed within the recess region 103. In example embodiments, the top surface 130s of the epitaxial layer 130 may be a flat surface that is coplanar or substantially coplanar with the top surface 100s of the substrate 100.

Referring to FIG. 7E, the epitaxial layer 130 can be grown from both of side and bottom surfaces of the recess region 103. In this case, the top surface 130s of the epitaxial layer 130 is not flat and, for example, has an arc-shaped section. By controlling a growth speed of silicon, the epitaxial layer 130 is formed to have the top surface 130s lower than a bottom surface 120s of the lowermost layer of the mold sacrificial layers 120.

Referring to FIG. 7F, the epitaxial layer 130 is formed so that the top surface 100s thereof is positioned at a level higher than the top surface 100s of the substrate 100, and thus, a side surface of the epitaxial layer 130 is in contact with part of the lowermost mold insulating layer 110. By controlling a growth speed of the epitaxial layer 130, the epitaxial layer 130 is formed to have the top surface 130s lower than the bottom surface 120s of the lowermost mold sacrificial layer 120. According to an embodiment, the epitaxial layer 130 protrudes outward from the top surface 100s of the substrate 100 and partially overlaps a side surface of the lowermost mold insulating layer 110, but the epitaxial layer 130 does not overlap the mold sacrificial layer 120 in the right and left direction. The top surface 130s of the epitaxial layer 130 can have a flat shape or an arc shape as shown in FIG. 7E.

Figure 7G:
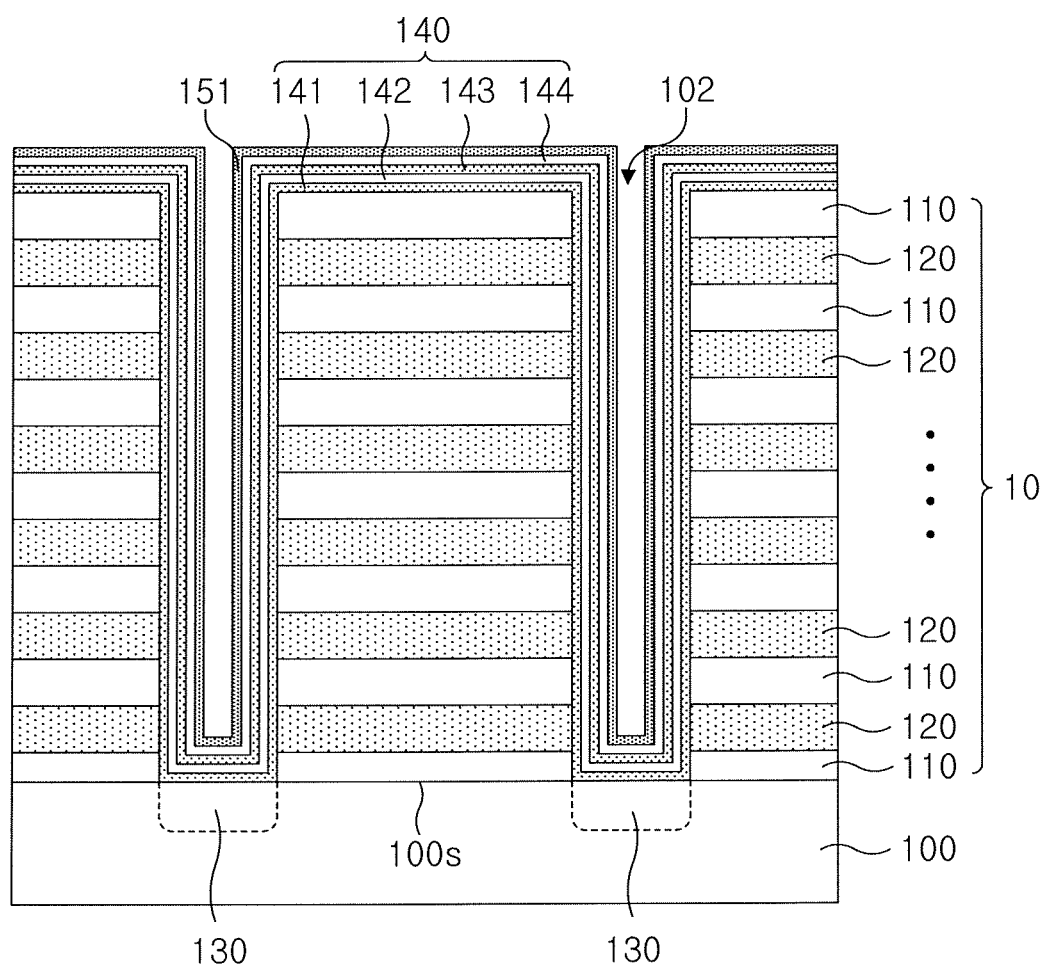

Referring to FIG. 7G, the gate insulating layer stack 140 is formed to cover an inner wall of the channel hole 102. In addition, a spacer layer 151 is further formed to cover the gate insulating layer stack 140. In accordance with an embodiment of the inventive concept, the gate insulating layer stack 140 and the spacer layer 151 do not fill the channel hole 102 completely and extend to cover the uppermost mold insulating layer 110. The gate insulating layer stack 140 can be formed by depositing a plurality of insulating layers, at least one of which is a charge trapping insulating material. For example, in accordance with an embodiment of the inventive concept, the gate insulating layer stack 140 is formed by sequentially depositing the first blocking insulating layer 141, the second blocking insulating layer 142, the trap insulating layer 143, and the tunnel insulating layer 144 using a chemical vapor deposition or an atomic layer deposition.

The trap insulating layer 143 can include at least one of insulating materials (e.g., a silicon nitride layer or a silicon oxynitride layer) having relatively abundant charge-trapping sites. In other embodiments, the trap insulating layer 143 can be a silicon nitride layer with conductive nanodots. The tunnel insulating layer 144 can be an insulating material having a bandgap greater than that of the trap insulating layer 143 (for example, a silicon oxide layer). At least one of the first and second blocking insulating layers 141 and 142 can include a high-k dielectric, whose bandgap is smaller than a bandgap of the tunnel insulating layer 144, but greater than a bandgap of the trap insulating layer 143. For example, the first blocking insulating layer 141 can include an aluminum oxide layer or a hafnium oxide layer, and the second blocking insulating layer 142 can include a silicon oxide layer. The spacer layer 151 can include an insulating material (e.g., a silicon oxide layer and a silicon nitride layer) or a semiconductor material (e.g., a single-crystalline silicon layer, a poly silicon layer, or an amorphous silicon layer).

Figure 7H:
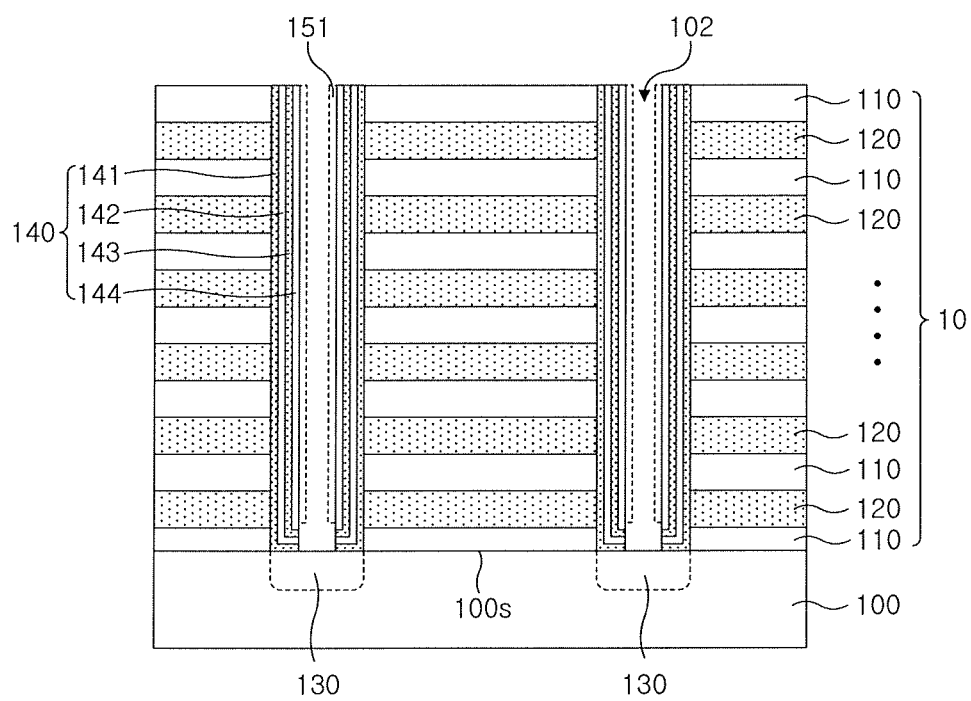

Referring to FIG. 7H, the gate insulating layer stack 140 is patterned to have a structure vertically extending along the inner sidewall of the channel hole 102. For example, the gate insulating layer stack 140 can be patterned through an anisotropic etching process to cover the inner sidewall of the channel hole 102 and a portion of the epitaxial layer 130. As the result of the anisotropic etching process, the spacer layer 151 is patterned to have a structure vertically extending along the tunnel insulating layer 144. In accordance with an embodiment of the inventive concept, during the anisotropic etching process, a lower portion of the gate insulating layer stack 140 below the spacer layer 151 is not etched or is slightly etched. According to an example embodiment, each of the first and second blocking insulating layers 141 and 142 and the trap insulating layer 143 include an 'L'-shaped portion disposed on the epitaxial layer 130. The tunnel insulating layer 144 is patterned to form a linear cylindrical structure or a cylindrical structure with an 'L'-shaped lower portion. The spacer layer 151 can be removed or remain. A shape of the gate insulating layer stack 140 may be modified, as previously described with reference to FIGS. 3A through 3E, but is not limited thereto. A horizontal thickness of the gate insulating layer stack 140 can be equivalent to or different from a vertical thickness of the lowermost mold insulating layer 110.

Figure 7I:
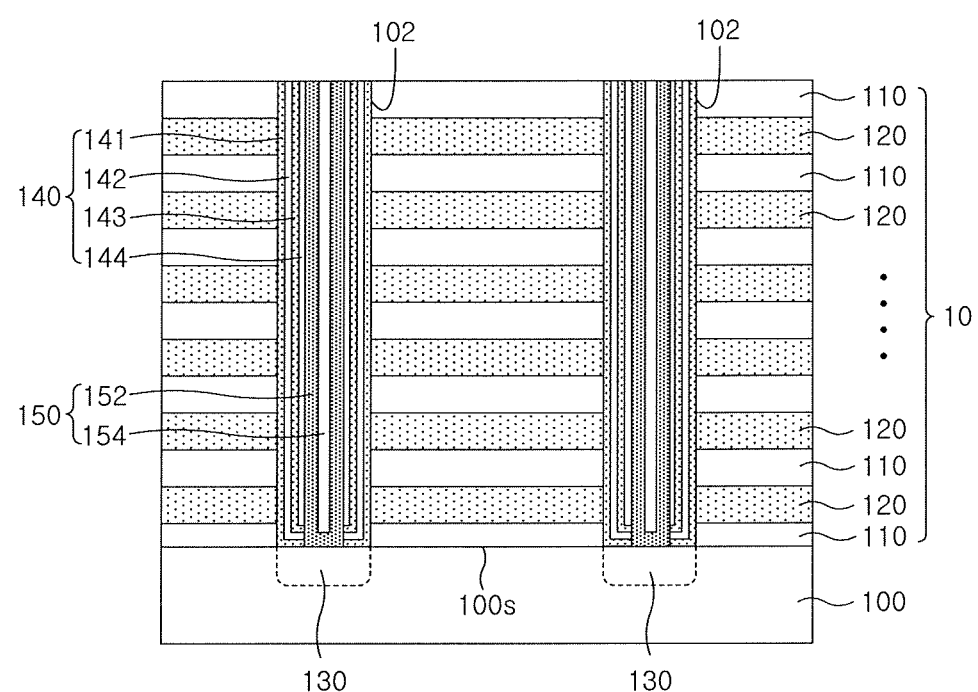

Referring to FIG. 7I, the vertical channel 150 is formed in the channel hole 102. The formation of the vertical channel 150 includes forming the cylindrical semiconductor layer 152 having a closed bottom portion and an open top portion, and then, depositing the inner insulating layer 154 on the structure provided with the semiconductor layer 152 to fill a remaining portion of the channel hole 102. In example embodiments, the semiconductor layer 152 surrounds the inner insulating layer 154 and is in contact with the epitaxial layer 130. The semiconductor layer 152 can be formed by a chemical vapor deposition or an atomic layer deposition and be formed of a single crystalline silicon layer, a poly silicon layer, or an amorphous silicon layer. The inner insulating layer 154 can be formed by depositing a silicon oxide layer. A shape of the vertical channel 150 may be modified, as previously described with reference to FIGS. 3A through 3E, but is not limited thereto.

Figure 7J:
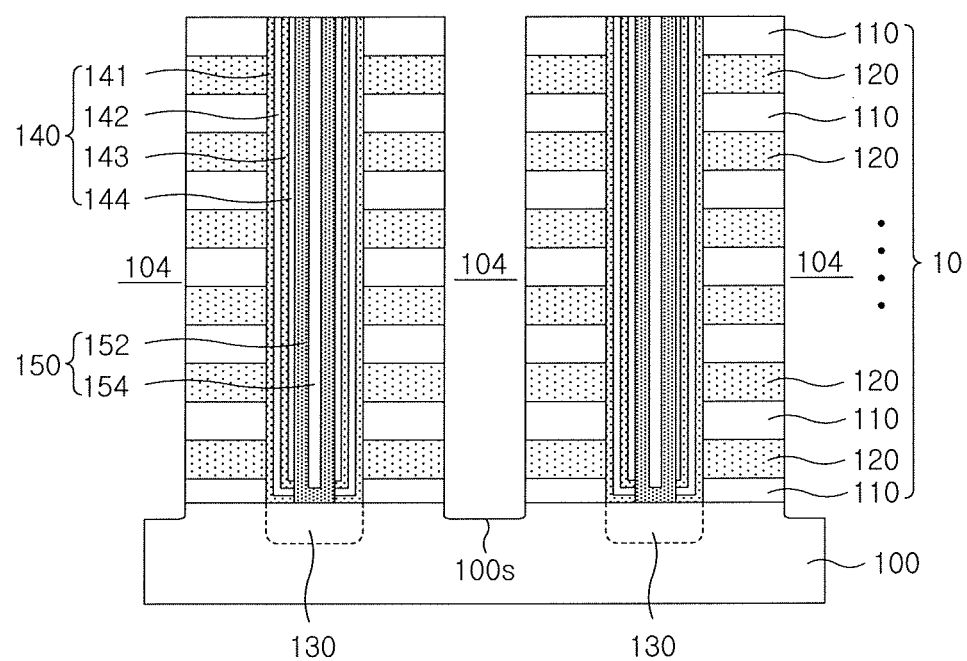

Referring to FIG. 7J, a trench 104 is formed to penetrate the mold stack 10. For example, in accordance with an embodiment of the inventive concept, the formation of the trench 104 includes anisotropic etching of the mold stack 10 to expose the top surface 100s of the substrate 100 between vertical channels 150. During the formation of the trench 104, the top surface 100s of the substrate 100 is over-etched and recessed. The trench 104 exposes sidewalls of the mold insulating layers 110 and the mold sacrificial layers 120. The trench 104 extends parallel to the front and rear directions and is formed to have a linear shape. Accordingly, from a plan view, the mold stack 10 has a linear pattern extending along the front and rear directions. Referring to FIG. 7J, the front and rear directions are out of and into the page, respectively.

Figure 7K:
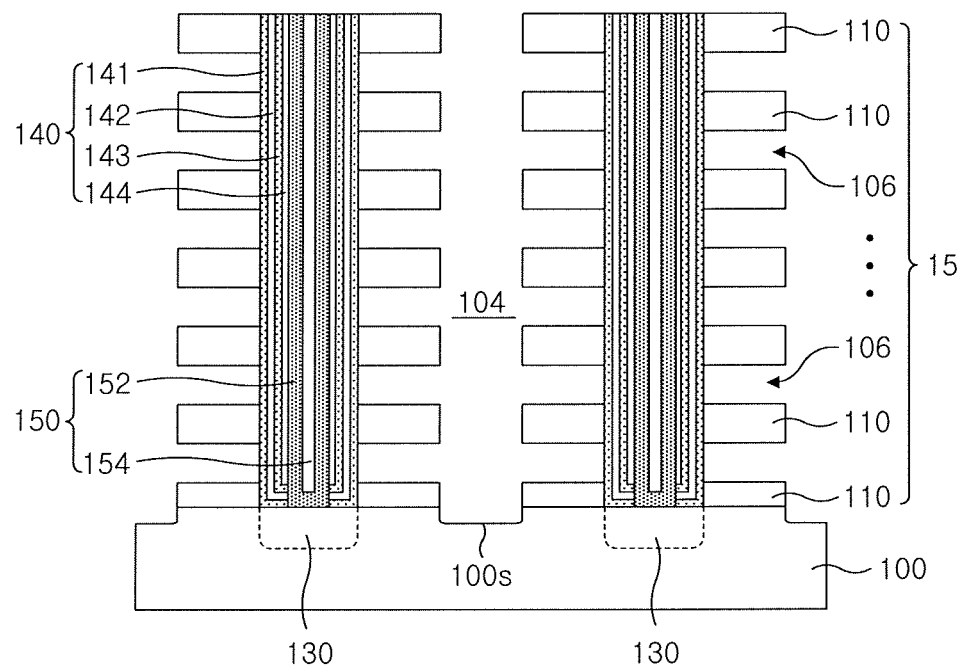

Referring to FIG. 7K, the mold wing 15 includes the mold insulating layers 110 spaced apart from each other along the vertical channel 150. In example embodiments, the formation of the mold wing 15 includes selectively removing the mold sacrificial layers 120. For example, in accordance with an embodiment of the inventive concept, the removal of the mold sacrificial layers 120 includes isotropically etching the mold sacrificial layers 120 with an etchant supplied through the trench 104. In the case where the mold insulating layers 110 are formed of a silicon oxide layer and the mold sacrificial layers 120 are formed of a silicon nitride layer, a phosphoric acid $H_3PO_4$ can be used as an etchant in the isotropic etching step. As the result of the removal of the mold sacrificial layers 120, spaces 106 are formed between the mold insulating layers 110 to expose the gate insulating layer stack 140.

Figure 7L:
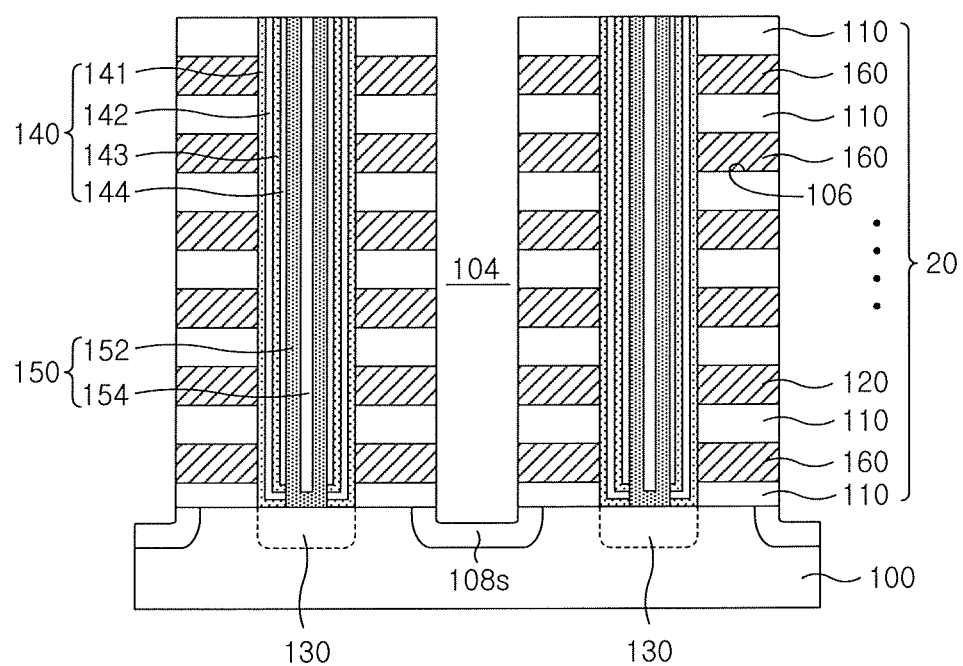

Referring to FIG. 7L, the gates 160 are formed in the spaces 106 to form the gate stack 20. In example embodiments, the gates 160 are vertically spaced apart from each other by the mold insulating layers 110 interposed therebetween. The formation of the gates 160 can include depositing and anisotropically etching a conductive layer (e.g., of silicon, metals, metal nitrides, or metal silicides) on the substrate 100. For example, the gates 160 can include a tungsten layer or a tantalum nitride layer. In accordance with an embodiment of the inventive concept, the substrate 100 exposed by the trench 104 is doped to form the common source 108s. The common source 108s is doped to have a different conductivity type (for example, n-type) from the substrate 100. For example, the common sources 108s can be connected to each other and be in an equipotential state. Alternatively, the common sources 108s can be electrically separated from each other, which can enable independent control of potentials of the common sources 108s. In accordance with an embodiment of the inventive concept, the gates 160 and the common source 108s are formed to be parallel to an extending direction of the trench 104 (for example, along the front and rear directions).

Figure 7M:
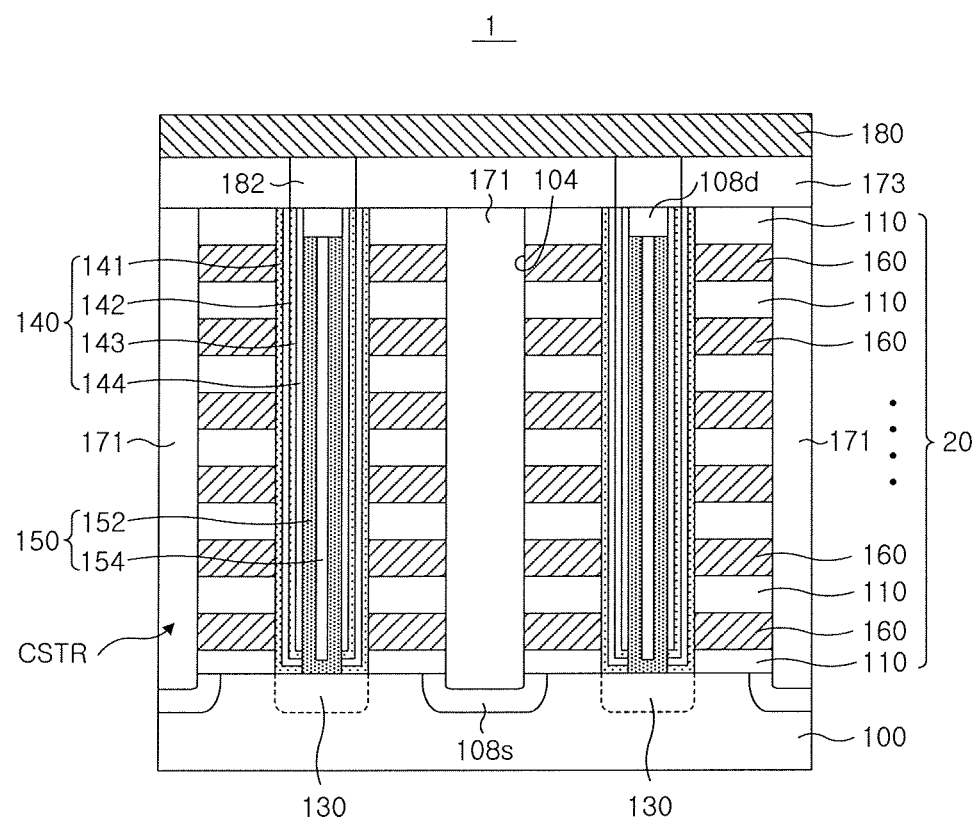

Referring to FIG. 7M, the insulating gap-fill layer 171 fills the trench 104, the interlayered insulating layer 173 covers the gate stack 20, and the bit line 180 is formed on the interlayered insulating layer 173 to be electrically connected to the vertical channel 150 via the plug 182. In example embodiments, the formation of the insulating gap-fill layer 171 can include depositing an insulating material to cover the gate stack 20, and then, performing a planarization process on the insulating material. In accordance with an embodiment of the inventive concept, the plug 182 is connected to the vertical channel 150 through the interlayered insulating layer 173, and the bit line 180 is formed on the interlayered insulating layer 173 and electrically connected to the vertical channel 150 via the plug 182. Alternatively, the insulating gap-fill layer 171 and the interlayered insulating layer 173 are simultaneously formed through a process of depositing an insulating material. To form the drain 108d, a doped semiconductor layer is formed on the vertical channel 150 before the formation of the interlayered insulating layer 173. Alternatively, the uppermost portion of the vertical channel 150 is doped with impurities to form the drain 108d having the same conductivity type (for example, n-type) as the common source 108s. The bit line 180 extends along a direction crossing the gates 160 or along the right and left directions. As the result of the above-described process steps, a semiconductor memory device, such as, for example, the semiconductor device 1 of FIG. 2A (e.g., a vertical NAND FLASH memory device) can be formed to include the epitaxial layer 130.

In the semiconductor memory device 1, the cell string CSTR includes the gates 160, which are vertically stacked along the vertical channel 150. The lowermost one of the gates 160 can serve as a ground selection line controlling an electric connection between the common source 108s and the vertical channel 150, while the uppermost one of the gates 160 can serve as a string selection line controlling an electric connection between the bit line 180 and the vertical channel 150. The remaining gates 160 can serve as word lines for controlling memory cells.

In alternative embodiments, if there is no or a negligible variation in etch depth when forming the vertical channel 150 (see FIG. 7B), the top surface 100s of the substrate 100 is not recessed. In this case, since it is not necessary to compensate for a variation in etch depth, there is no need to form the recess region 103 in the substrate 100, and thus, the step of forming the epitaxial layer 130 may be omitted.

In accordance with an embodiment of the inventive concept, during the formation of the vertical channel 150 described with reference to FIG. 7I, a semiconductor layer is formed to completely fill an inner space of the vertical channel 150. In this case, the resultant structure can have the same structure as the semiconductor memory device 2 shown in FIG. 4A.

In accordance with an embodiment of the inventive concept, instead of the formation of the mold stack 10 described with reference to FIG. 7A, the gate stack 20 may be formed to include the mold insulating layers 110 and the gates 160, which are alternatingly stacked on the substrate. Thereafter, the channel hole 102, the gate insulating layer stack 140, the vertical channel 150, and the bit line 180 are sequentially formed such that a semiconductor memory device, for example, one the same as or similar to the semiconductor memory device 1 of FIG. 2A, can be fabricated.

FIGS. 8A through 8D are sectional views illustrating a method of fabricating a semiconductor memory device according to an example embodiment of the inventive concept.

Figure 8A:
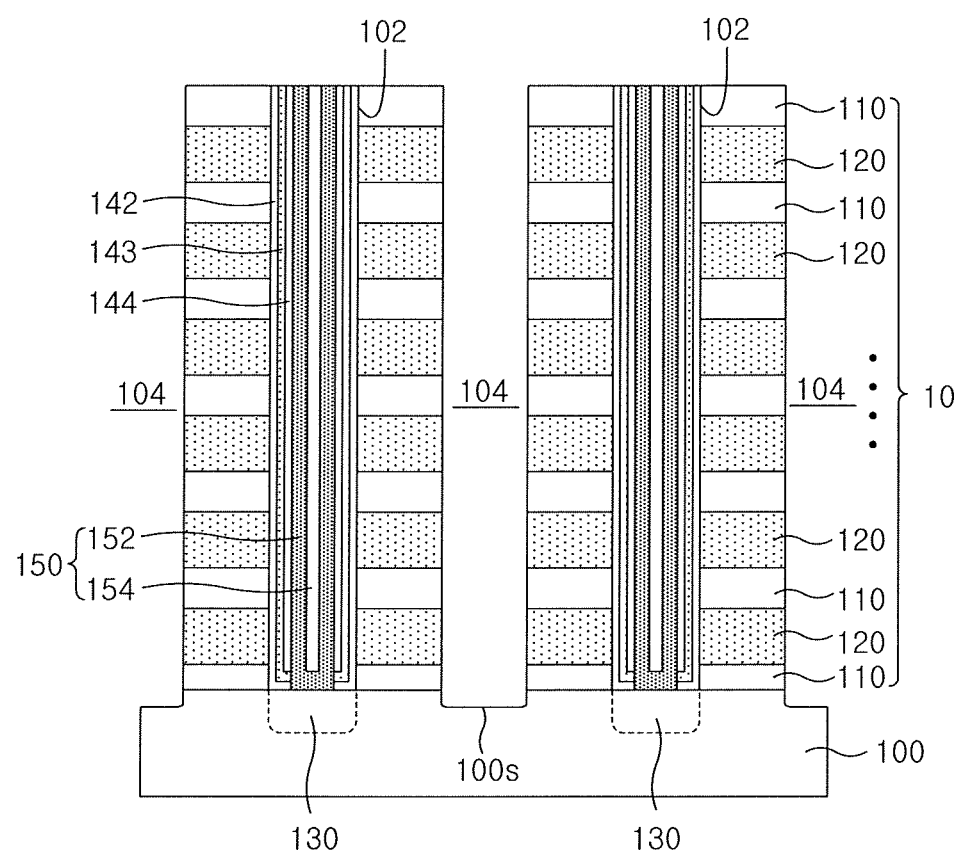
FIGS. 8A through 8D are sectional views illustrating a method of fabricating a semiconductor memory device according to an example embodiment of the inventive concept.

Referring to FIG. 8A, the mold stack 10 is formed on the substrate 100 to include the mold insulating layers 110 and the mold sacrificial layers 120, which are alternatingly and repeatedly stacked on the substrate 100. Thereafter, the vertical channel 150 is formed through the mold stack 10. The vertical channel 150 stands on the top surface 100s of the substrate 100 vertically and is electrically connected to the epitaxial layer 130. The tunnel insulating layer 144, the trap insulating layer 143, and the second blocking insulating layer 142 are formed to surround the vertical channel 150, and the trench 104 is formed between the vertical channels 150 to expose the top surface 100s of the substrate 100 through the mold stack 10. The mold stack 10, the vertical channel 150, the tunnel insulating layer 144, the trap insulating layer 143, the second blocking insulating layer 142, and the trench 104 can be formed by using the processes described with reference to FIGS. 7A through 7J. In the case where the top surface 100s of the substrate 100 is not recessed during the formation of the channel hole 102, the step of forming the epitaxial layer 130 may be omitted. The vertical channel 150 may include the semiconductor layer 152 surrounding the inner insulating layer 154 or a pillar structure with the semiconductor layer completely filling the channel hole 102.

Figure 8B:
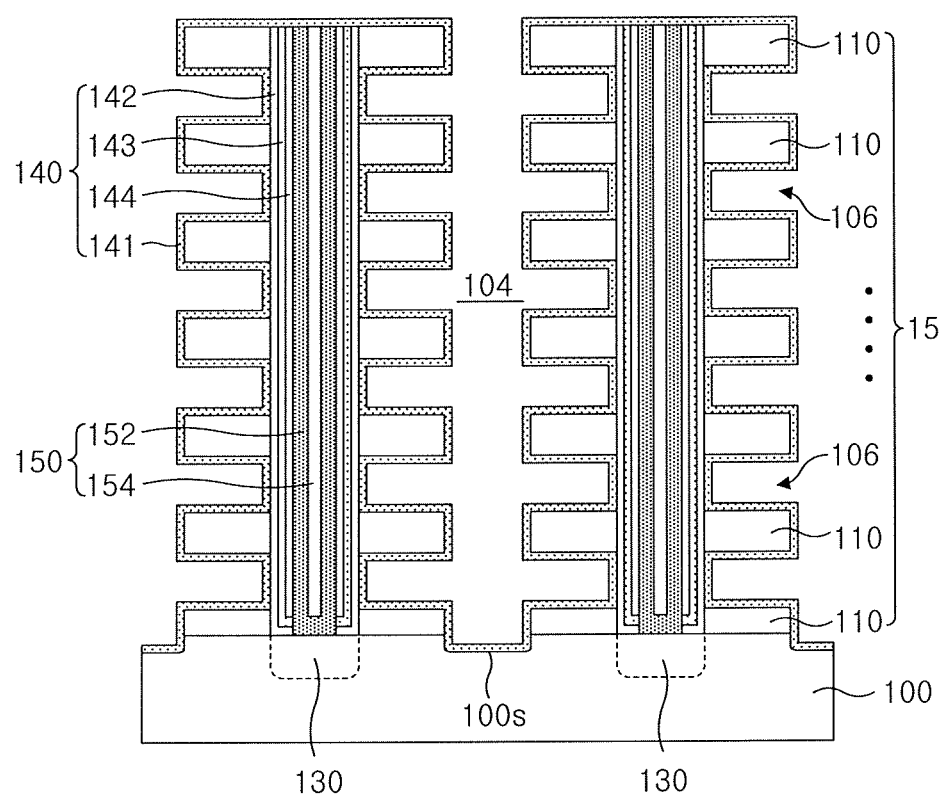

Referring to FIG. 8B, the mold sacrificial layers 120 are selectively removed to form a mold wing 15 including the mold insulating layers 110, which are vertically spaced apart from each other along the vertical channel 150. The removal of the mold sacrificial layers 120 can be performed using the isotropic etching process described with reference to FIG. 7K. Thereafter, the first blocking insulating layer 141 is formed to cover the mold insulating layers 110 and the second blocking insulating layer 142 exposed by the spaces 106. According to the present embodiment, some insulating layers 142-144 of the gate insulating layer stack 140 surround the vertical channel 150, while the remaining insulating layers of the gate insulating layer stack 140 (e.g., the first blocking insulating layer 141) cover the exposed surface of the mold wing 15. In alternative example embodiments, the first and second blocking insulating layers 141 and 142 cover the mold wing 15, while the trap insulating layer 143 and the tunnel insulating layer 144 surround the vertical channel 150.

Figure 8C:
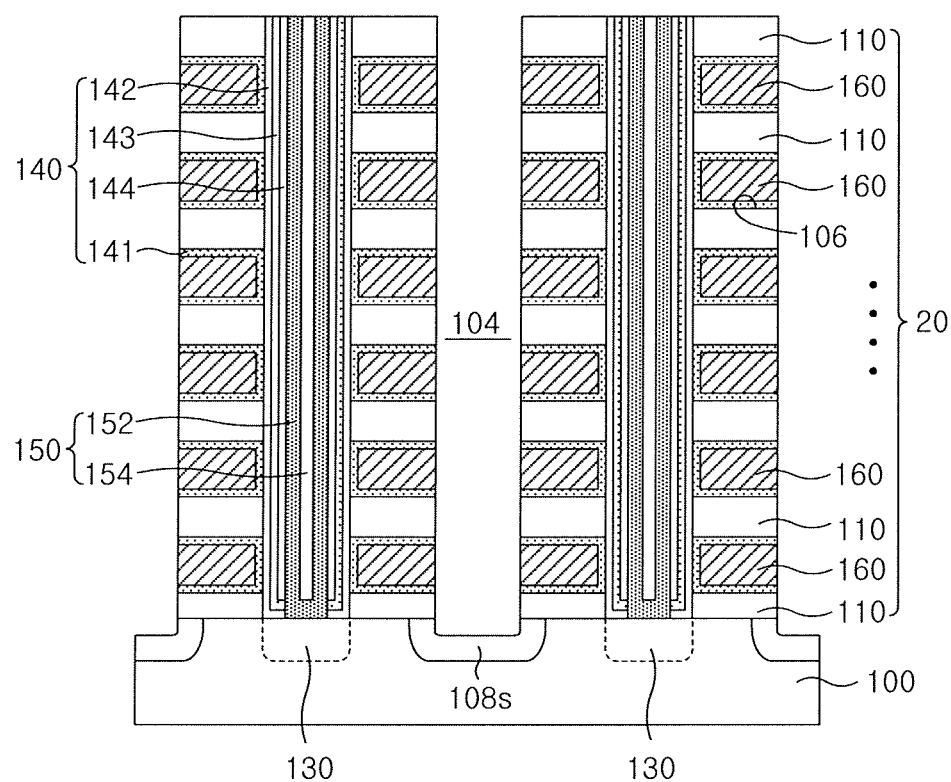

Referring to FIG. 8C, a conductive layer is deposited on the substrate 100 and patterned to form the gate stack 20 including the gates 160 provided in the spaces 106. The first blocking insulating layer 141 is patterned to have a folded structure surrounding the gate 160. Thereafter, the top surface 100s of the substrate 100 exposed by the trench 104 can be doped to form the common source 108s.

Figure 8D:
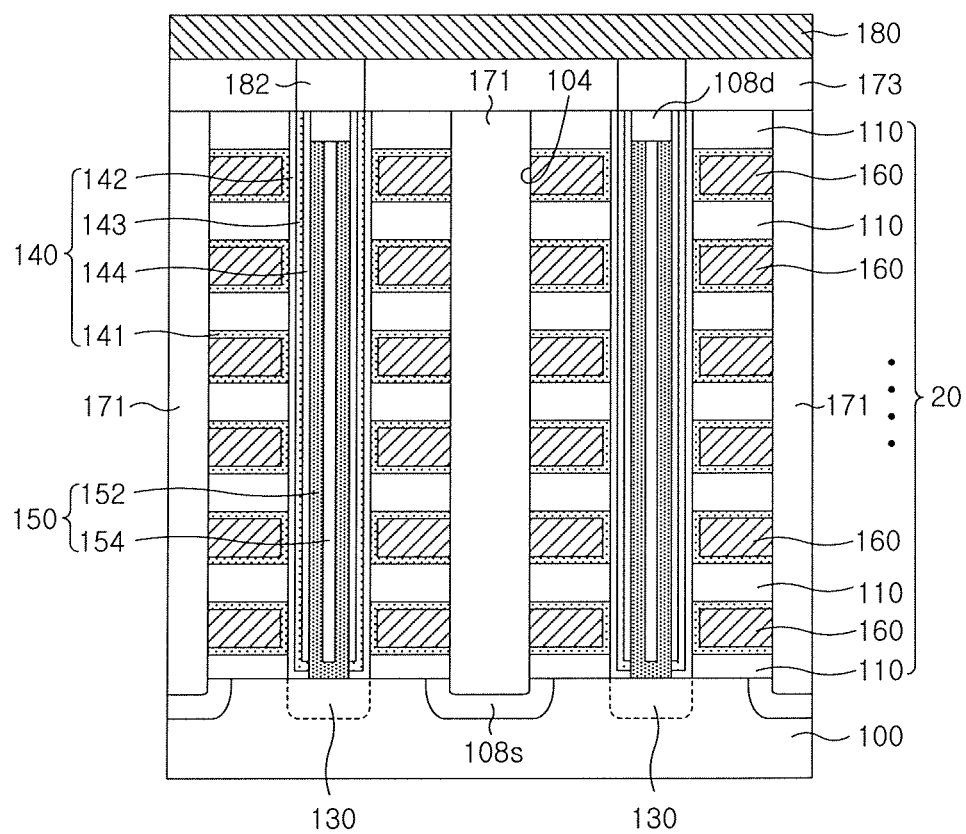

Referring to FIG. 8D, the insulating gap-fill layer 171, the plug 182, the interlayer insulating layer 173, and the bit line 180 are formed using the process described with reference to FIG. 7M, and the resulting structure can have the same or substantially same structure as the semiconductor memory device 3 of FIG. 5A.

FIGS. 9A through 9E are sectional views illustrating a method of fabricating a semiconductor memory device according to an example embodiment of the inventive concept.

Figure 9A:
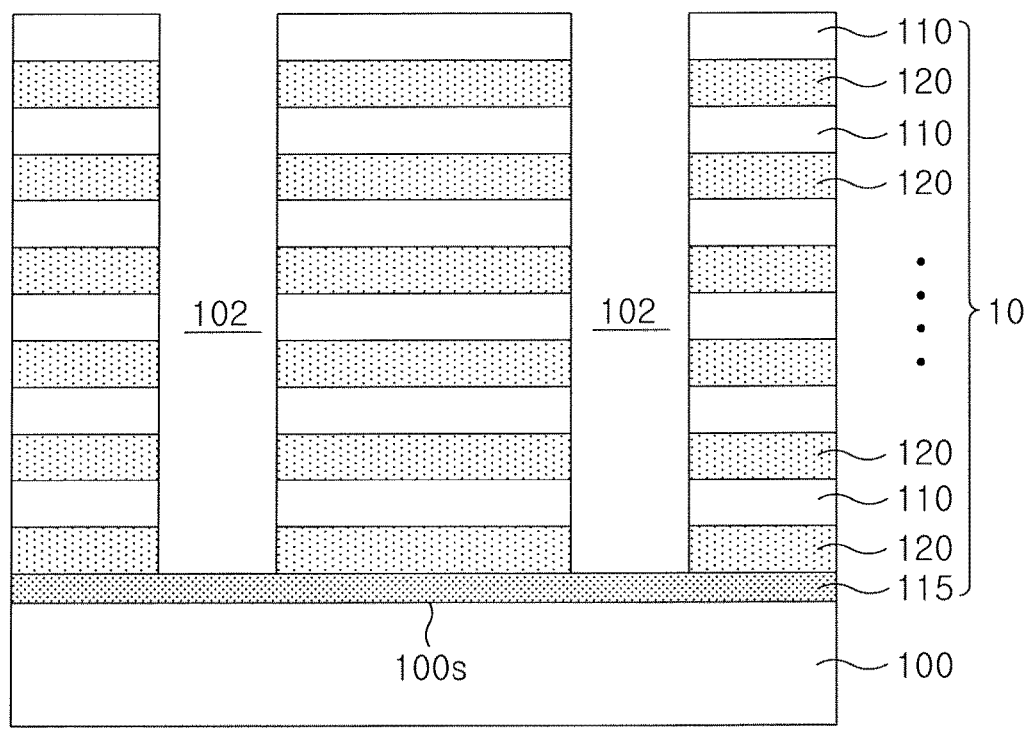
FIGS. 9A through 9E are sectional views illustrating a method of fabricating a semiconductor memory device according to an example embodiment of the inventive concept.

Referring to FIG. 9A, the mold stack 10 is formed on the substrate 100 and patterned to form the channel hole 102. The formation of the mold stack 10 includes forming the etch stop layer 115 on the top surface 100s of the substrate 100, and alternatingly forming the mold sacrificial layers 120 and the mold insulating layers 110 on the etch stop layer 115. The mold insulating layers 110 and the mold sacrificial layers 120 are formed of insulating materials having etch selectivity with respect to each other. The etch stop layer 115 is formed of an insulating material having etch selectivity with respect to the mold insulating layers 110 and the mold sacrificial layers 120. In example embodiments, a silicon oxide layer, a silicon oxynitride layer, a silicon nitride layer, a silicon carbide layer, an amorphous carbon layer, a high-k dielectric (e.g., $HfO_2$ or $Al_2O_3$), a low-k dielectric (e.g., a SiCOH layer or a porous insulating layer) can be used for the etch stop layer 115. For example, the mold insulating layers 110 can be formed of a silicon oxide layer, and the mold sacrificial layers 120 can be formed of a silicon nitride layer, and the etch stop layer 115 can be formed of at least one selected from the enumerated materials except for the silicon oxide layer and the silicon nitride layer. The channel hole 102 can be formed by anisotropically etching the mold stack 10. In example embodiments, due to the presence of the etch stop layer 115, the top surface 100s of the substrate 100 is not exposed during the formation of the channel hole 102.

Figure 9B:
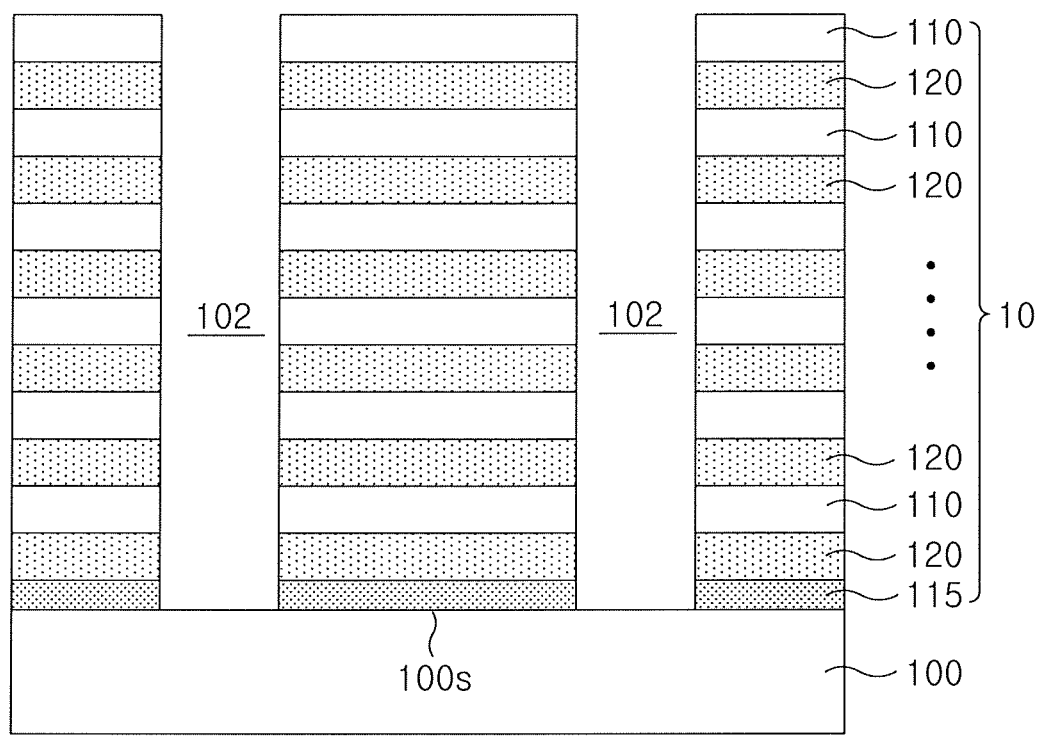

Referring to FIG. 9B, a portion of the etch stop layer 115 exposed by the channel hole 102 is selectively removed, for example, by a wet etch process. Accordingly, the channel hole 102 exposes the top surface 100s of the substrate 100. According to the present embodiment, the etch stop layer 115 prevents or suppresses the top surface 100s of the substrate 100 from being recessed in the step of forming the channel hole 102. As a result, the steps of forming the recess region 103 in the substrate 100 and forming the epitaxial layer 130 to fill the recess region 103 can be omitted.

Figure 9C:
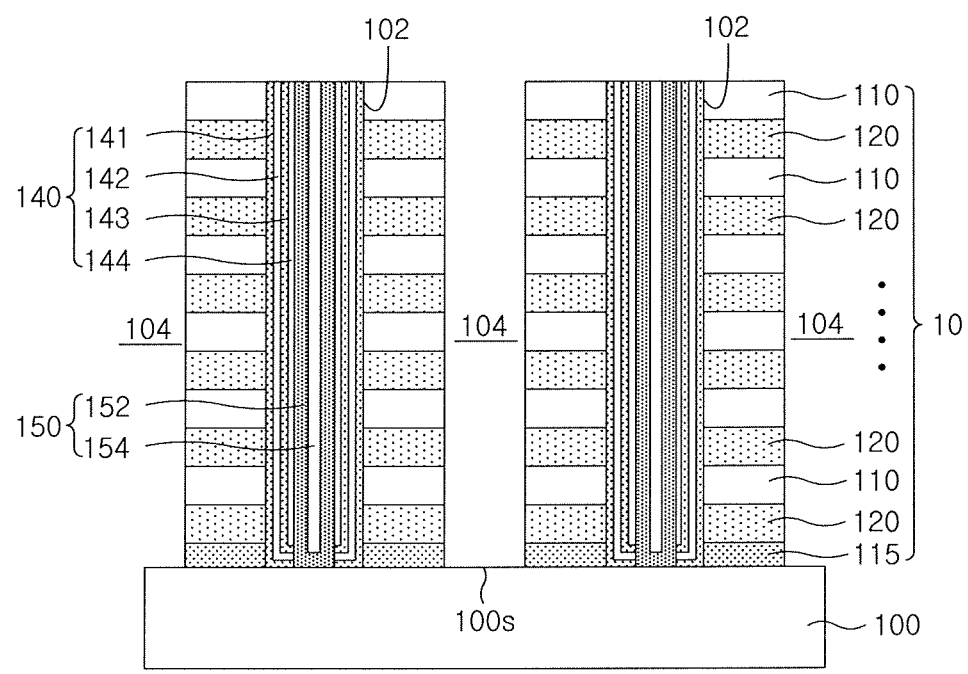

Referring to FIG. 9C, the gate insulating layer stack 140 is formed in the channel hole 102 to cover part of the top surface 100s of the substrate 100. The gate insulating layer stack 140 can be formed using the processes described with reference to FIGS. 7G through 7J. The formation of the gate insulating layer stack 140 includes, for example, sequentially depositing and patterning the first blocking insulating layer 141, the second blocking insulating layer 142, the trap insulating layer 143, and the tunnel insulating layer 144. Thereafter, the vertical channel 150 can be formed in the channel hole 102. The vertical channel 150 can include the semiconductor layer 152 having a cylindrical structure with a closed bottom portion, and the inner insulating layer 154 surrounded by the semiconductor layer 152. Alternatively, the vertical channel 150 can be a semiconductor pillar. Next, the mold stack 10 can be patterned to form the trench 104 exposing the top surface 100s of the substrate 100 between adjacent vertical channels 150. The formation of the trench 104 includes selectively removing the mold insulating layers 110 and the mold sacrificial layers 120 to expose the etch stop layer 115, and selectively removing the exposed portion of the etch stop layer 115 to expose the top surface 100s of the substrate 100. In example embodiments, due to the presence of the etch stop layer 115, it is possible to prevent or suppress the top surface 100s of the substrate 100 from being recessed during the formation of the trench 104.

Figure 9D:
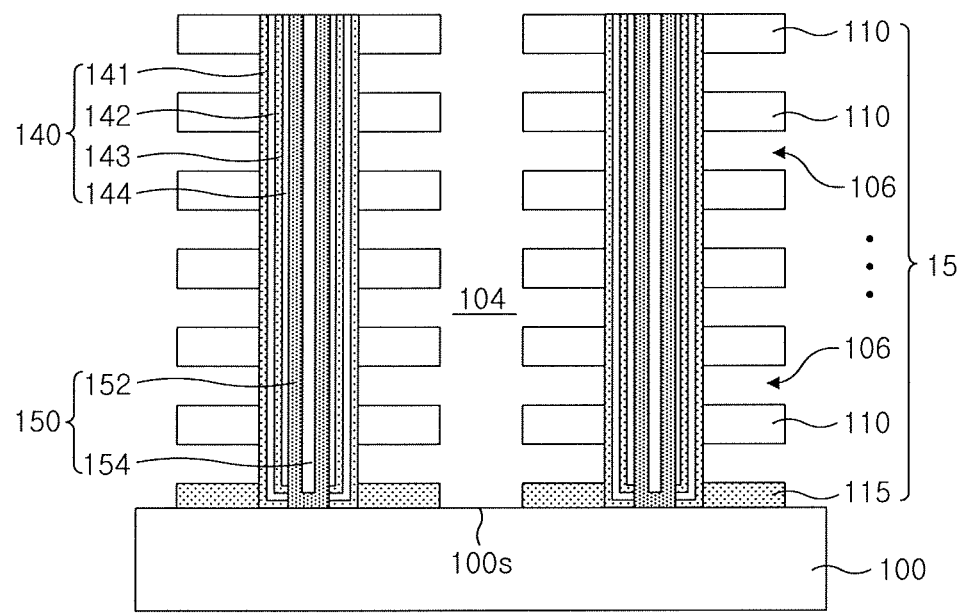

Referring to FIG. 9D, the mold sacrificial layers 120 are selectively removed by using the isotropic etching process described with reference to FIG. 7K. Accordingly, the mold wing 15 can be formed to include the etch stop layer 115 and the mold insulating layers 110 stacked over the etch stop layer 115 and spaced apart from each other along the vertical channel 150. The mold sacrificial layers 120 are removed to form the spaces 106 exposing the gate insulating layer stack 140.

Figure 9E:
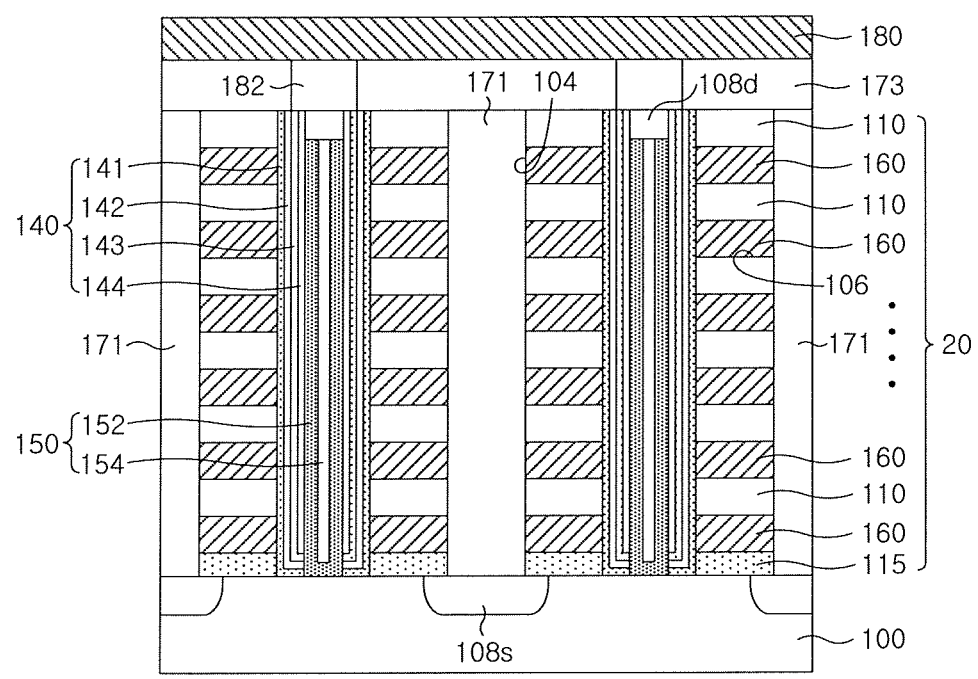

Referring to FIG. 9E, similar to the process described with reference to FIG. 7L, the gates 160 forming part of the gate stack 20 are formed by filling the spaces 106 with a conductive layer, and the substrate 100 exposed by the trench 104 can be doped to form the common source 108s. Thereafter, the insulating gap-fill layer 171, the plug 182, the interlayer insulating layer 173, and the bit line 180 are formed using the process described with reference to FIG. 7M, and the resulting structure can have the same or substantially the same structure as the semiconductor memory device 4 of FIG. 6A.

Figure 10A:
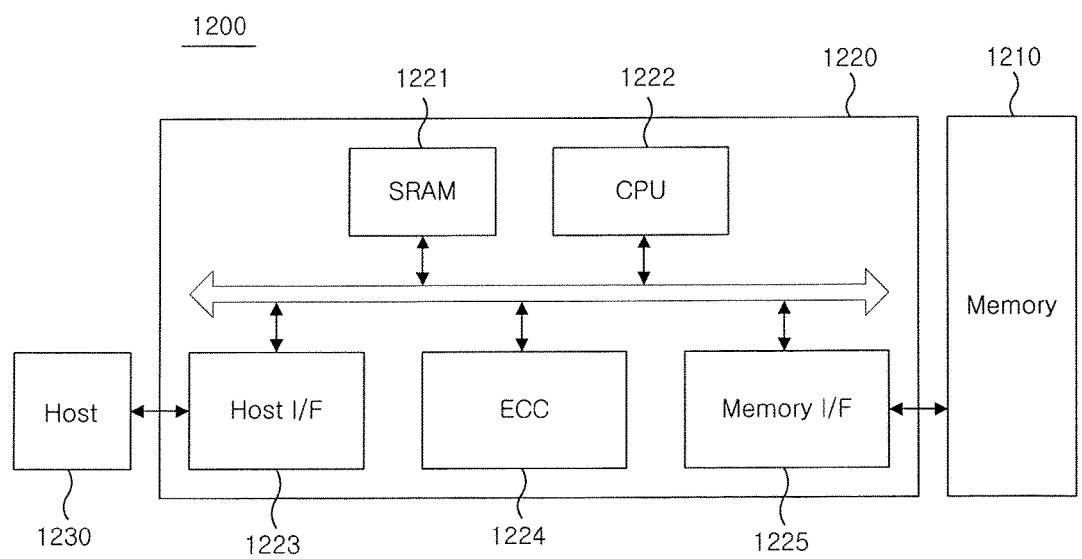
FIG. 10A is a block diagram illustrating a memory card including a semiconductor memory device according to an example embodiment of the inventive concept.

FIG. 10A is a block diagram illustrating a memory card including a semiconductor memory device according to example embodiments of the inventive concept.

Referring to FIG. 10A, a memory card 1200 includes a memory controller 1220 controlling general data exchanges between a host and the memory device 1210. A static random access memory (SRAM) 1221 can be used as an operating memory of a processing unit 1222. A host interface 1223 can include a data exchange protocol of a host connected to a memory card 1200. An error correction block 1224 can detect and correct errors included in data read from a multi-bit memory device 1210. A memory interface 1225 interfaces with the memory device 1210. A processing unit 1222 performs general control operations for data exchange of the memory controller 1220. In accordance with an embodiment of the inventive concept, the memory card 1200 can be formed using a memory device 1210 including at least one of the three-dimensional semiconductor memory devices 1 to 4 according to example embodiments of the inventive concept.

Figure 10B:
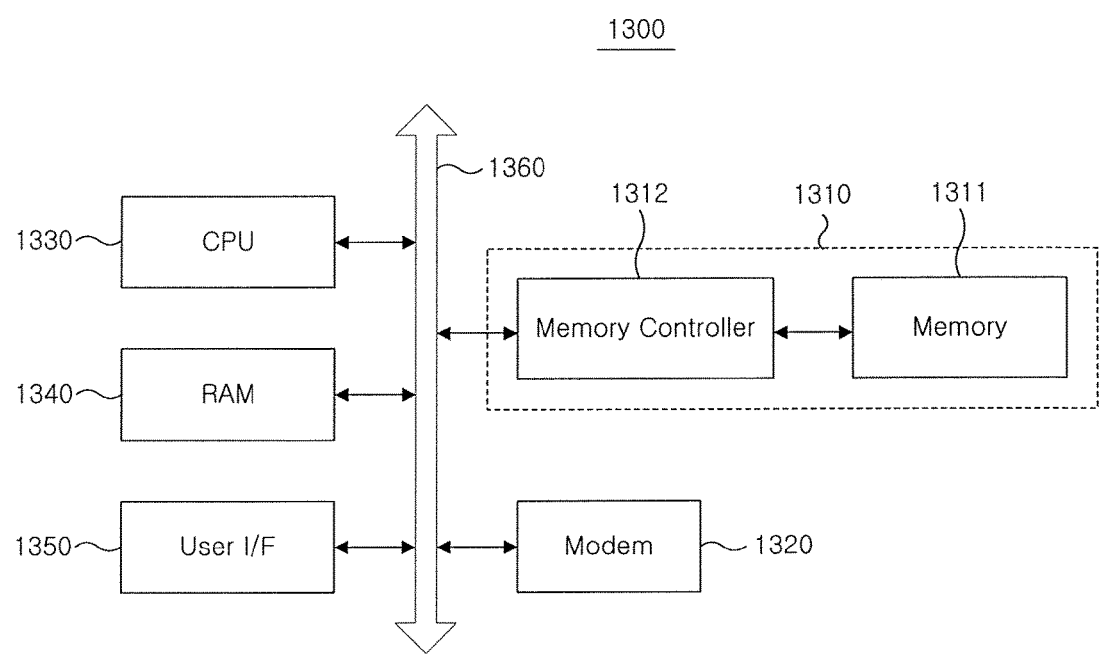
FIG. 10B is a block diagram illustrating an information processing system including a semiconductor memory device according to an example embodiment of the inventive concept.

FIG. 10B is a block diagram illustrating an information processing system including a semiconductor memory device according to example embodiments of the inventive concept.

Referring to FIG. 10B, an information processing system 1300 uses a memory system 1310 including at least one of the three-dimensional semiconductor memory devices 1 to 4 according to example embodiments of the inventive concept. The information processing system 1300 can be a mobile device and/or a desktop computer. In some embodiments, the information processing system 1300 further includes a modem 1320, a central processing unit (CPU) 1330, a random access memory (RAM) 1340, and a user interface 1350, which are electrically connected to a system bus 1360, in addition to the memory system 1310. The memory system 1310 can include a memory device 1311 and a memory controller 1312. In some embodiments, the memory system 1310 can be configured identical or substantially identical to the memory card 1200 described with respect to FIG. 10A. Data processed by the CPU 1330 and/or input from an outside source may be stored in the memory system 1310. In some embodiments, the memory system 1310 can be used as a portion of a solid state drive (SSD). When used as a portion of a solid state drive (SSD), the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to embodiments of the inventive concept.

According to example embodiments of the inventive concepts, memory cells are three-dimensionally arranged and a gate insulating layer stack is formed to have a structure vertically extending along a vertical channel. As a result, a size of a semiconductor device is reduced. An epitaxial layer electrically connected to the substrate can be further formed to overlap a portion of a gate insulating layer stack. As a result, a substrate recess caused by a variation in etch depth is repaired, and an increase in current path caused by the substrate recess is prevented from occurring. As a result, the device according to example embodiments of the inventive concept has improved electrical characteristics.

While example embodiments of the inventive concept have been particularly shown and described, it will be understood by one of ordinary skill in the art that variations in form and detail may be made therein without departing from the spirit and scope as set forth in the appended claims.

What is claimed is:

1. A semiconductor memory device, comprising:
a substrate;
a gate stack vertically stacked on the substrate;
a channel hole penetrating the gate stack to the substrate; and
a channel in the channel hole and electrically connected to the substrate, wherein the substrate comprises an epitaxial layer in the substrate below the channel hole, wherein a top surface of the epitaxial layer is positioned at or higher than a top surface of the substrate, and under a bottom surface of a lowermost gate of the gate stack.

2. The device of claim 1, wherein the top surface of the epitaxial layer has a flat shape or an arc shape.

3. The device of claim 2, wherein the top surface of the epitaxial layer has the arc shape protruding convexly from the top surface of the substrate toward the bottom surface of the lowermost gate.

4. The device of claim 2, wherein the top surface of the epitaxial layer has the arc shape protruding concavely toward the top surface of the substrate.

5. The device of claim 1, wherein the channel contacts the top surface of the epitaxial layer.

6. The device of claim 1, further comprising a memory layer surrounding the channel, wherein the memory layer comprises at least one insulating layer on the top surface of the epitaxial layer and vertically extending along the channel.

7. The device of claim 6, wherein the memory layer further comprises at least one insulating layer surrounding gates of the gate stack.

8. The device of claim 1, wherein the gate stack comprises a plurality of insulating layers alternatingly stacked with a plurality of gates, and a thickness of a lowermost insulating layer of the plurality of insulating layers is less than a thickness of a next stacked insulating layer in the gate stack.

9. The device of claim 1, wherein the epitaxial layer comprises a same material as the substrate.

10. The device of claim 1, wherein a crystal axis of the epitaxial layer is oriented in a different direction from that of the substrate or in a same direction as that of the substrate.

11. The device of claim 1, wherein the epitaxial layer has the same conductivity type as the substrate.

12. The device of claim 6, wherein the at least one insulating layer comprises a vertical portion vertically extending along the channel and a horizontal portion horizontally extending along and overlapping the top surface of the epitaxial layer.

13. The device of claim 1, wherein the channel is a multi-layered structure comprising a cylindrical semiconductor layer having a closed bottom portion connected to the epitaxial layer and an open top portion and an inner insulating layer surrounded by the cylindrical semiconductor layer.

14. The device of claim 1, wherein the channel is a single layered structure comprising a semiconductor layer connected to the epitaxial layer and vertically extending along the channel hole.

15. The device of claim 13, wherein a width of the closed bottom portion tapers outward with decreasing distance from the epitaxial layer.

16. The device of claim 13, wherein a width of the closed bottom portion tapers inward with decreasing distance from the epitaxial layer.

17. The device of claim 13, wherein the closed bottom portion has a substantially triangular shape.

18. The device of claim 1, wherein:
the gate stack comprises a plurality of insulating layers alternatingly stacked with a plurality of gates;
the lowermost gate of the plurality of gates is connected to a ground selection line;
a next stacked gate of the plurality of gates is connected to a word line; and
a structure of the channel adjacent the lowermost gate is a same as a structure of the channel adjacent the next stacked gate.

19. A semiconductor memory device, comprising:
a substrate:
a gate stack vertically stacked on the substrate, the gate stack including a plurality of insulating layers alternately with a plurality of gates;
a channel penetrating the gate stack;
a gate insulating stack between the gate stack and between the channel; and
an epitaxial layer in the substrate below the channel and being in contact with the channel, wherein a top surface of the epitaxial layer is positioned at a level lower than a bottom surface of a lowermost gate of the plurality of gates,
wherein the lower most gate of the plurality of gates is connected to a ground selection line and a next stacked gate of the plurality of gates is connected to a word line, and
wherein the epitaxial layer is separated from the lowermost gate by the gate insulating stack.

* * * * *